United States Patent
Chan et al.

(10) Patent No.: US 10,833,054 B2
(45) Date of Patent: Nov. 10, 2020

(54) SMART PIXEL SURFACE MOUNT DEVICE PACKAGE

(71) Applicant: CREE HUIZHOU SOLID STATE LIGHTING COMPANY LIMITED, Huizhou, Guangdong (CN)

(72) Inventors: Chi Keung Alex Chan, Hong Kong (CN); Zhenyu Zhong, Hong Kong (CN); Chak Hau Charles Pang, Hong Kong (CN); Yue Kwong Victor Lau, Hong Kong (CN); Erzhuang Liu, Shanghai (CN)

( * ) Notice: Subject to any disclaimer, the term of this patent is extended or adjusted under 35 U.S.C. 154(b) by 51 days.

(21) Appl. No.: 15/116,203

(22) PCT Filed: Feb. 8, 2014

(86) PCT No.: PCT/CN2014/071908
§ 371 (c)(1),
(2) Date: Aug. 2, 2016

(87) PCT Pub. No.: WO2015/117273
PCT Pub. Date: Aug. 13, 2015

(65) Prior Publication Data
US 2017/0009971 A1    Jan. 12, 2017

(51) Int. Cl.
*H01L 25/075* (2006.01)
*H01L 23/00* (2006.01)
(Continued)

(52) U.S. Cl.
CPC ............ *H01L 25/0753* (2013.01); *F21V 7/04* (2013.01); *F21V 17/101* (2013.01); *F21V 23/06* (2013.01);
(Continued)

(58) Field of Classification Search
CPC .......... F21V 23/005; F21V 23/06; F21V 7/04; F21V 17/01; H01L 24/97; H01L 25/0753;
(Continued)

(56) References Cited

U.S. PATENT DOCUMENTS

| 7,170,480 B2 | 1/2007 | Boldt, Jr. et al. |
| 2001/0028356 A1* | 10/2001 | Balogh .............. G02B 27/2214 345/589 |

(Continued)

FOREIGN PATENT DOCUMENTS

| CN | 101088140 | 12/2007 |
| CN | 201039515 | 3/2008 |

(Continued)

OTHER PUBLICATIONS

International Search Report, International Application No. PCT/CN2014/071908, International Filing Date Feb. 8, 2014.

*Primary Examiner* — Mary Ellen Bowman
(74) *Attorney, Agent, or Firm* — Ferguson Case Orr Paterson

(57) ABSTRACT

Emitter panels and displays utilizing solid state packages and methods for fabricating the same are disclosed. One emitter panel comprises a raised barrier on a submount defining a plurality of cavities, each cavity having at least one LED in a pixel area. The panel is capable of receiving electrical signals for independently controlling the emission from the emitters. Solid state displays utilize the emitter panels mounted in relation to one another to generate a message or image. The panels comprise multiple pixels each having at least one light emitter, with each panel capable of receiving electrical signals for independently controlling the emission of at the pixels.

48 Claims, 19 Drawing Sheets

(51) Int. Cl.
  *F21V 7/04* (2006.01)
  *F21V 17/10* (2006.01)
  *F21V 23/06* (2006.01)
  *H05K 1/18* (2006.01)
  *H05K 3/00* (2006.01)
  *H05K 3/28* (2006.01)
  *H05K 3/30* (2006.01)
  *F21Y 113/13* (2016.01)
  *G09G 5/02* (2006.01)
  *G09G 5/10* (2006.01)

(52) U.S. Cl.
  CPC ............. H01L 24/97 (2013.01); H05K 1/181 (2013.01); H05K 3/0044 (2013.01); H05K 3/284 (2013.01); H05K 3/303 (2013.01); *F21Y 2113/13* (2016.08); *G09G 5/02* (2013.01); *G09G 5/10* (2013.01); *G09G 2300/0452* (2013.01); *G09G 2320/0209* (2013.01); *G09G 2320/0666* (2013.01); *H01L 2224/48091* (2013.01); *H01L 2224/48227* (2013.01); *H01L 2924/181* (2013.01); *H01L 2933/0033* (2013.01); *H05K 2201/10106* (2013.01); *H05K 2203/1316* (2013.01); *H05K 2203/1327* (2013.01)

(58) Field of Classification Search
  CPC ...... H05K 1/181; H05K 3/0044; H05K 3/284; H05K 3/303
  See application file for complete search history.

(56) References Cited

U.S. PATENT DOCUMENTS

| | | | |
|---|---|---|---|
| 2005/0212007 A1* | 9/2005 | Daniels | B32B 17/10036 257/100 |
| 2006/0046347 A1* | 3/2006 | Wood | H01L 21/56 438/106 |
| 2007/0284605 A1* | 12/2007 | Chen | H01L 25/167 257/99 |
| 2008/0158876 A1* | 7/2008 | Thrailkill | F21K 9/00 362/235 |
| 2009/0278139 A1* | 11/2009 | Fjelstad | H01L 25/0753 257/88 |
| 2009/0322197 A1* | 12/2009 | Helbing | H01L 33/507 313/46 |
| 2010/0317132 A1* | 12/2010 | Rogers | H01L 25/0753 438/27 |
| 2013/0221380 A1* | 8/2013 | Ankireddi | H01L 25/0753 257/88 |
| 2013/0256711 A1* | 10/2013 | Joo | H01L 33/486 257/88 |
| 2013/0334445 A1* | 12/2013 | Tharumalingam | H01L 24/97 250/552 |

FOREIGN PATENT DOCUMENTS

| | | |
|---|---|---|
| CN | 101840101 | 9/2010 |
| CN | 103424948 | 12/2013 |
| KR | 2010-0118457 | 11/2010 |

* cited by examiner

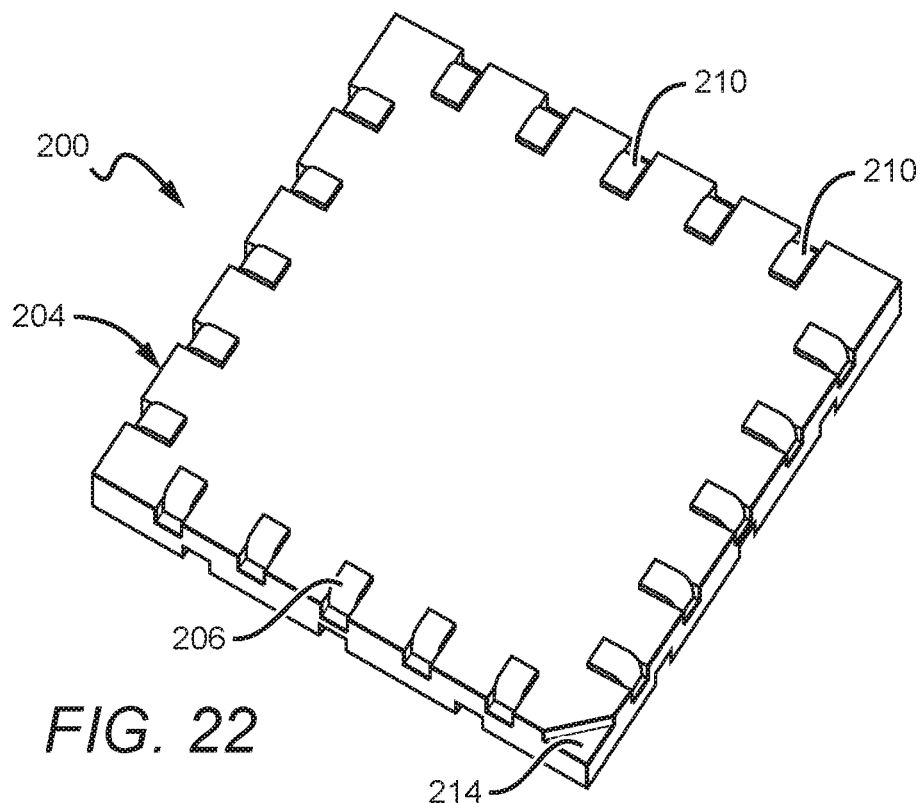
FIG. 22
FIG. 23
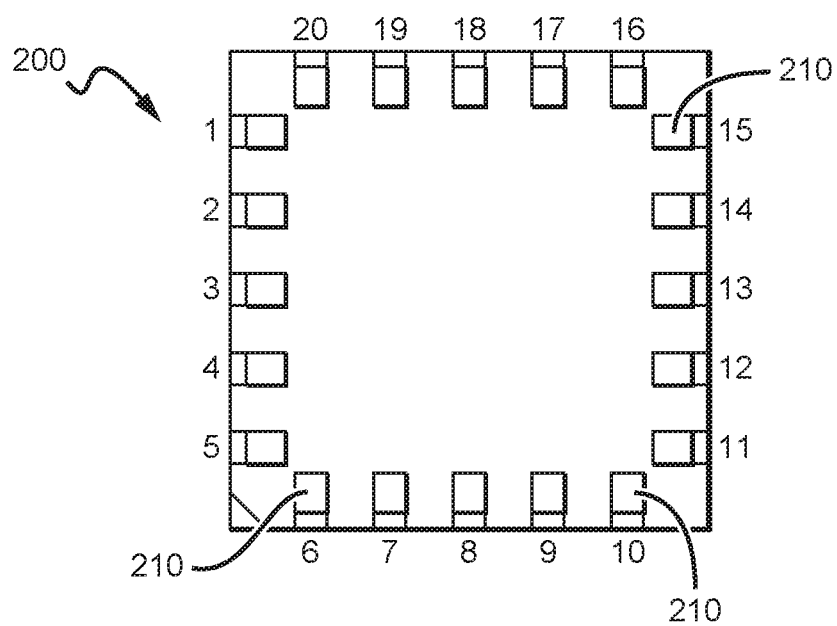

FIG. 32
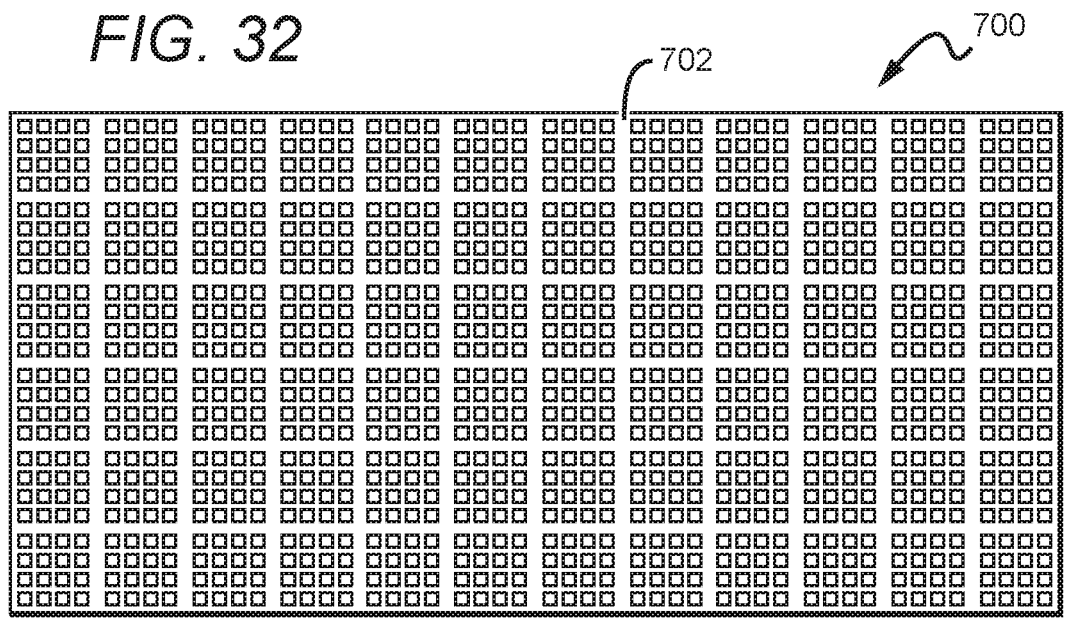
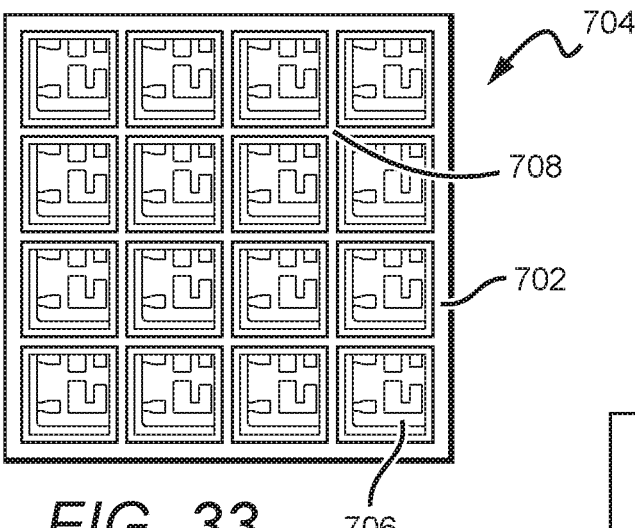
FIG. 33
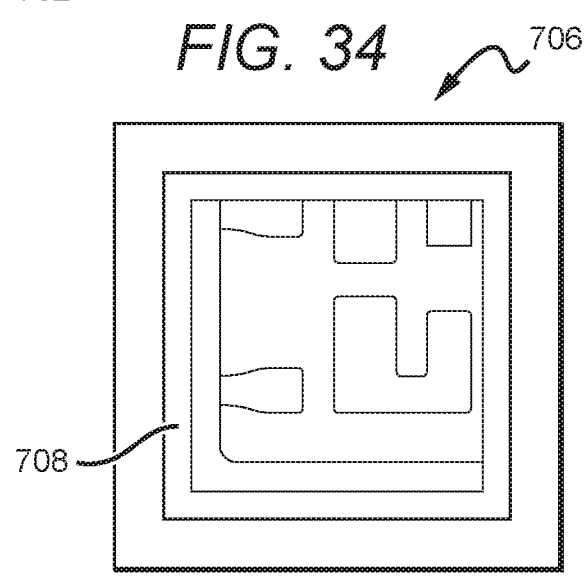
FIG. 34

SMART PIXEL SURFACE MOUNT DEVICE PACKAGE

RELATED APPLICATION

This is a US National Stage application of International Application No. PCT/CN2014/071908 filed Feb. 8, 2014.

BACKGROUND OF THE INVENTION

Field of the Invention

This invention relates to light emitting diode packages, displays utilizing light emitting diode packages as their light source, and processes for fabricating such packages and displays.

Description of the Related Art

Light emitting diodes (LED or LEDs) are solid state devices that convert electric energy to light, and generally comprise one or more active layers of semiconductor material interposed between oppositely doped layers. When a bias is applied across the doped layers, holes and electrons are injected into the active layer where they recombine to generate light. Light is emitted from the active layer and from all surfaces of the LED.

Technological advances over the last decade or more has resulted in LEDs having a smaller footprint, increased emitting efficiency, and reduced cost. LEDs also have an increased operation lifetime compared to other emitters. For example, the operational lifetime of an LED can be over 50,000 hours, while the operational lifetime of an incandescent bulb is approximately 2,000 hours. LEDs can also be more robust than other light sources and can consume less power. For these and other reasons, LEDs are becoming more popular and are now being used in more and more applications that have traditionally been the realm of incandescent, fluorescent, halogen and other emitters.

In order to use an LED chip in conventional applications it is known to enclose an LED chip in a package to provide environmental and/or mechanical protection, color selection, light focusing, and the like. An LED package also includes electrical leads, contacts or traces for electrically connecting the LED package to an external circuit. In a typical two-pin LED package/component 10 illustrated in FIG. 1, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup 13 may be filled with an encapsulant material 16 and a wavelength conversion material, such as a phosphor, can be included in over the LED chip or in the encapsulant. Light emitted by the LED at a first wavelength may be absorbed by the phosphor, which may responsively emit light at a second wavelength. The entire assembly can then be encapsulated in a clear protective resin 14, which may be molded in the shape of a lens to direct or shape the light emitted from the LED chip 12.

A conventional LED package 20 illustrated in FIG. 2 may be more suited for high power operations which may generate more heat. In the LED package 20, one or more LED chips 22 are mounted onto a carrier such as a printed circuit board (PCB) carrier, substrate or submount 23. A metal reflector 24 mounted on the submount 23 surrounds the LED chip(s) 22 and reflects light emitted by the LED chips 22 away from the package 20. The reflector 24 also provides mechanical protection to the LED chips 22. One or more wirebond connections 21 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond.

FIG. 3 shows another LED package 30 comprising a casing 32, and a lead frame 34 at least partially embedded in the casing 32. The lead frame 34 is arranged for surface mounting of the package 30. Portions of lead frame 34 are exposed through a cavity in the casing 32 with three LEDs 36a-c mounted on part of the lead frame 34 and connected to other parts of the lead frame by wire bonds 38. Different types of LEDs 36a-c can be used, with some packages having red, green and blue emitting LEDs. The package 30 comprises a pin-out structure with six pins 40 and the lead frame is arranged so that the emission of each of the LEDs 36a-c can be controlled independently by a respective pair of the pins 40. This allows the package to emit a variety of color combinations from the LEDs 36a-c.

Different LEDs packages, such as those shown in FIGS. 1-3, can be used as the light source for signs and displays, both big and small. Large screen LED based displays (often referred to as giant screens) are becoming more common in many indoor and outdoor locations, such as at sporting arenas, race tracks, concerts and in large public areas such as Times Square in New York City. With current technology, some of these displays or screens can be as large as 60 feet tall and 60 feet wide. As technology advances it is expected that larger screens will be developed.

These screens can comprise thousands or hundreds of thousands of "pixels" or "pixel modules", each of which can contain one or more LED chips or packages. The pixel modules can use high efficiency and high brightness LED chips that allow the displays to be visible from relatively far away, even in the daytime when subject to sunlight. In some signs each pixel can have a single LED chip, and pixel modules can have as few as three or four LEDs (such as one red, one green, and one blue) that allow the pixel to emit many different colors of light from combinations of red, green and/or blue light. The pixel modules can be arranged in a rectangular grid that can include hundreds of thousands of LEDs or LED packages. In one type of display, the grid can be 640 modules wide and 480 modules high, with the size of the screen being dependent upon the actual size of the pixel modules. As the number of pixels increases, the interconnect complexity for the display also increases. This interconnect complexity can be one of the major expenses for these displays, and can be one of the major sources of failure during manufacturing and during the operational lifetime of the display.

BRIEF DESCRIPTION OF THE DRAWINGS

FIG. 22 is bottom perspective view of the LED package shown in FIGS. 17 and 18;

FIG. 23 is another bottom view of the LED package shown in FIGS. 17 and 18 with one pin numbering arrangement;

FIG. 32 is a top plan view of an emitter panel according to an embodiment of the present invention.

FIG. 33 is a top plan view of an emitter module according to an embodiment of the present invention.

FIG. 34 is a top plan view of a pixel according to an embodiment of the present invention.

DETAILED DESCRIPTION OF THE INVENTION

Figure 1:
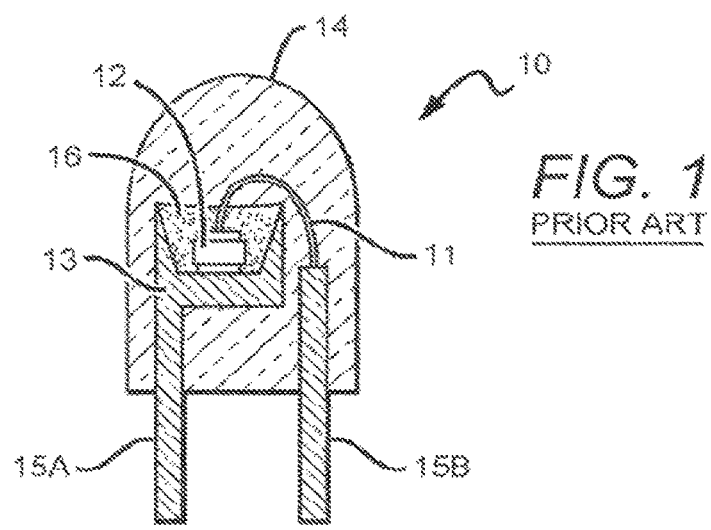
FIG. 1 is a side view of a conventional light emitting diode package.
Figure 2:
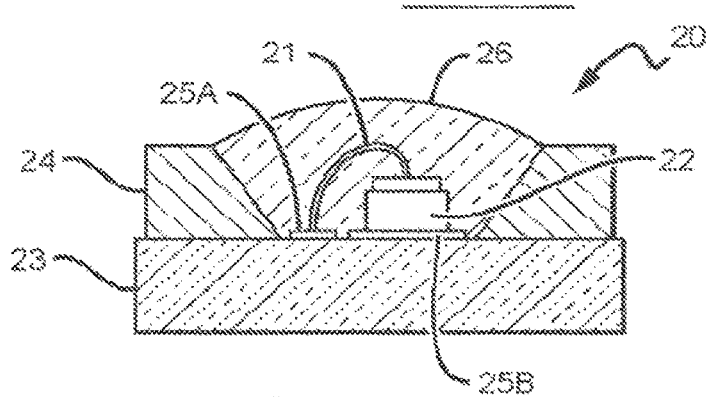
FIG. 2 is a side view of another conventional light emitting diode package.
Figure 3:
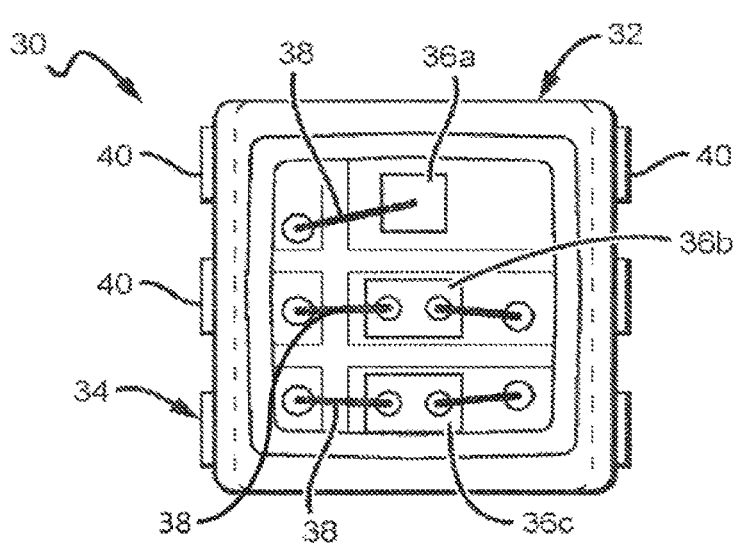
FIG. 3 is a plan view of another conventional light emitting diode package.
Figure 4:
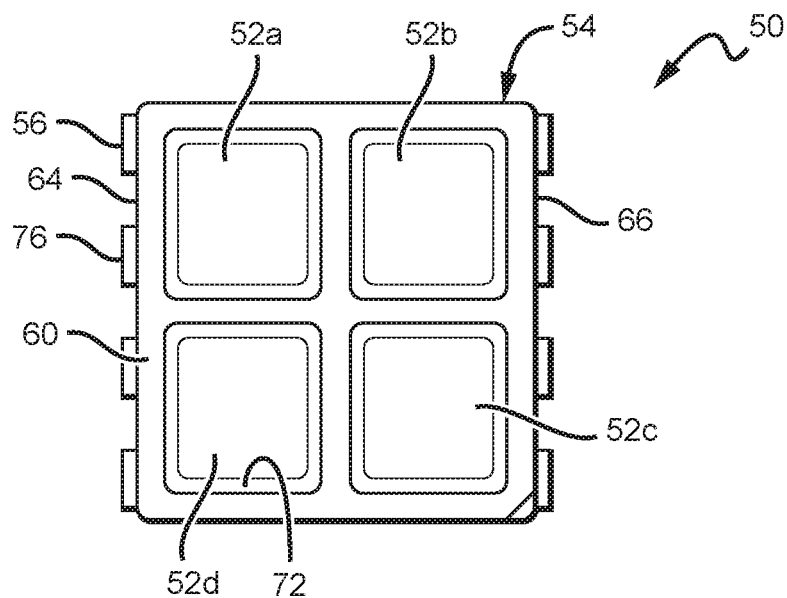
FIG. 4 is a plan view of one embodiment of an LED package according to the present invention.
Figure 5:
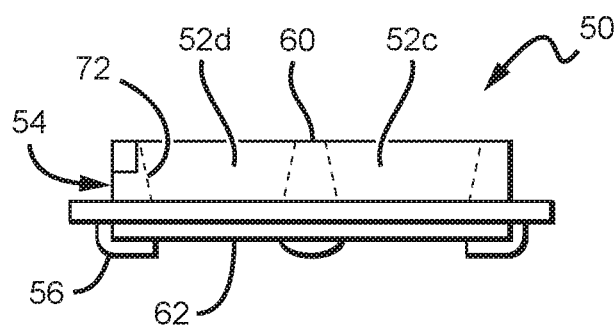
FIG. 5 is a side view of the LED package shown in FIG. 4.
Figure 6:
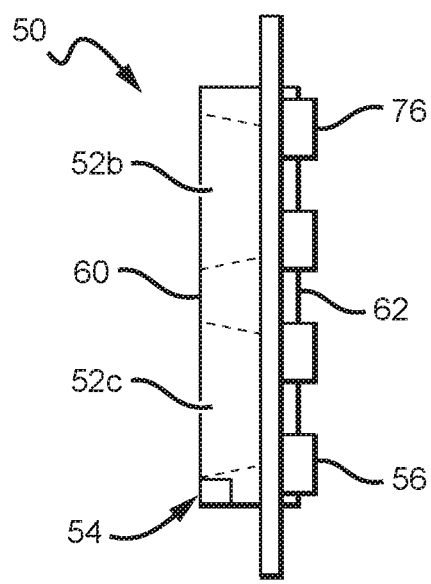
FIG. 6 is another side view of the LED package shown in FIG. 4.

The present invention is directed to improved LED packages and LED displays utilizing the LED packages, with the LED packages according to the present invention comprising "multiple pixel" packages. That is, the packages comprise more than one pixel, with each of the pixels comprising one or more light emitting diodes. The different embodiments comprise different features for applying an electrical signal to the LED in the pixels. In some embodiments, a respective electrical signal can be applied to each of the pixels to control its emission color and/or intensity, while in other embodiments two or more of the pixels can be controlled by the same electrical signal. In embodiments where the pixels have multiple LEDs one or more of the LEDs in each pixel can be controlled by respective signals, while in other embodiments the LEDs in different pixels can be controlled by the same signal. In some of these embodiments, the same signal can be used to control the emission of two or more pixels, while in other embodiments each of the pixels can be controlled be controlled by a respective signal.

In some embodiments, the term pixel is understood in its common meaning to be an element of an image that can be individually processed or controlled in a display system. In some of these embodiments, some or all of the pixels can comprise red, green, and blue emitting LEDs, with at least some of the pixels being arranged to allow for the intensity of each LED in the pixel to be controllable. This allows for each pixel to emit a color of light that is a combination of red, green or blue light, and allows for flexibility in driving each pixel so that it can emit different colors that are a combination of light from the LEDs.

In other embodiments, the packages can comprise pixels that can emit a single color of light, with these packages used in different applications such as lighting or backlighting. In some of these embodiments, the pixel can emit white light and can comprise at least one blue LED with one or more phosphors, with the LED emitting a white light combination of blue and phosphor light. Different ones of these embodiments can allow for control over the individual LEDs in each pixel, while in other embodiments the LEDs can be driven by the same drive signal. In some embodiments the pixels can comprise a one or more white emitting LEDs in combination with a red emitting LED to achieve the desired pixel emission, such as the desired color temperature. In other embodiments, emission of the LEDs in the pixel can be controlled to such that the pixel emits different color temperatures in the cool to warm temperature spectrum.

The packages according to the present invention can have many different shapes and sizes and can be arranged with many different numbers of pixels. In some embodiments, the packages can be square and can have pixels in a format of 2 by 2, 4 by 4, 8 by 8, etc. In other embodiments, the packages can be rectangular shapes and can have pixels in a format with fewer pixels in one direction compared to the pixels in another direction. For example, the packages can have pixel formats of 2 by 3, 4, 5, 6, etc., 3 by 4, 5, 6, 7, etc., or 4 by 4, 5, 6, 7, 8, etc. In still other embodiments, the pixels can be in a linear array of pixels 2, 3, 4, 5, etc. long. These are only some of the shapes for the packages, with others being triangular, circular or non-regular shaped.

The LED package according to the present invention provide certain advantages over the prior art single pixel packages. The LED packages can result in a lower per pixel cost by reducing material costs, such as lead frame materials. The pitch between adjacent pixels can also be reduced while maintaining a lambertian beam profile. By reducing the pitch between pixels, higher resolution displays can be manufactured. The display manufacturing costs can also be reduced by reducing handling costs and pick and place assembly costs. The complexity of the pixel interconnects can also reduced, thereby reducing materials costs and the display manufacturing level. This can also reduce the potential interconnects that could fail over the lifetime of the display.

The present invention can be directed to many different package types, with some of the embodiments below being surface mount devices. It is understood that the present invention can also be used with other package types such as packages with pins for through hole mounting processes.

The LED packages according to the present invention can be used in LED signs and displays, but it is understood that they can be used in many different applications. The LED packages can comply with different industry standards making them appropriate for use in LED based signs, channel letter lighting, or general backlighting and illumination applications. Some embodiments can also comprise a flat top emitting surface making them compatible to mate with light pipes. These are only a few of the many different applications for the LED packages according to the present invention.

Some LED package embodiments according to the present invention can comprise a single LED chip or multiple LED chips and can comprise a reflective cup surrounding the LED chip or chips. The upper surface of casing around each of the reflective cups can comprise a material that contrasts with that of the light emitted by the LED chips. The portion of the casing exposed within the cup, and/or the reflective surfaces within the cup can also comprise a material that is reflective of the light from the LED chips. In some of these embodiments light emitted from the LED chips can be white or other wavelength converted light, and the surface of the submount within the reflective cup and the reflective surfaces of the cup can be white or otherwise reflective of the white or wavelength converted light. The contrasting upper surface of the reflective cup can be many different colors, but in some embodiments is black.

The present invention is described herein with reference to certain embodiments, but it is understood that the invention can be embodied in many different forms and should not be construed as limited to the embodiments set forth herein. In particular, many different LED chips, reflective cup and lead frame arrangements can be provided beyond those described above, and the encapsulant can provide further features to improve the reliability and emission characteristics from the LED packages and LED displays utilizing the LED packages. Although the different embodiments of LED packages are discussed herein as being used in an LED display, the LED packages can be used in many different lighting applications.

It is also understood that when an element such as a layer, region or substrate is referred to as being "on" another element, it can be directly on the other element or intervening elements may also be present. Furthermore, relative terms such as "above" and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 7:
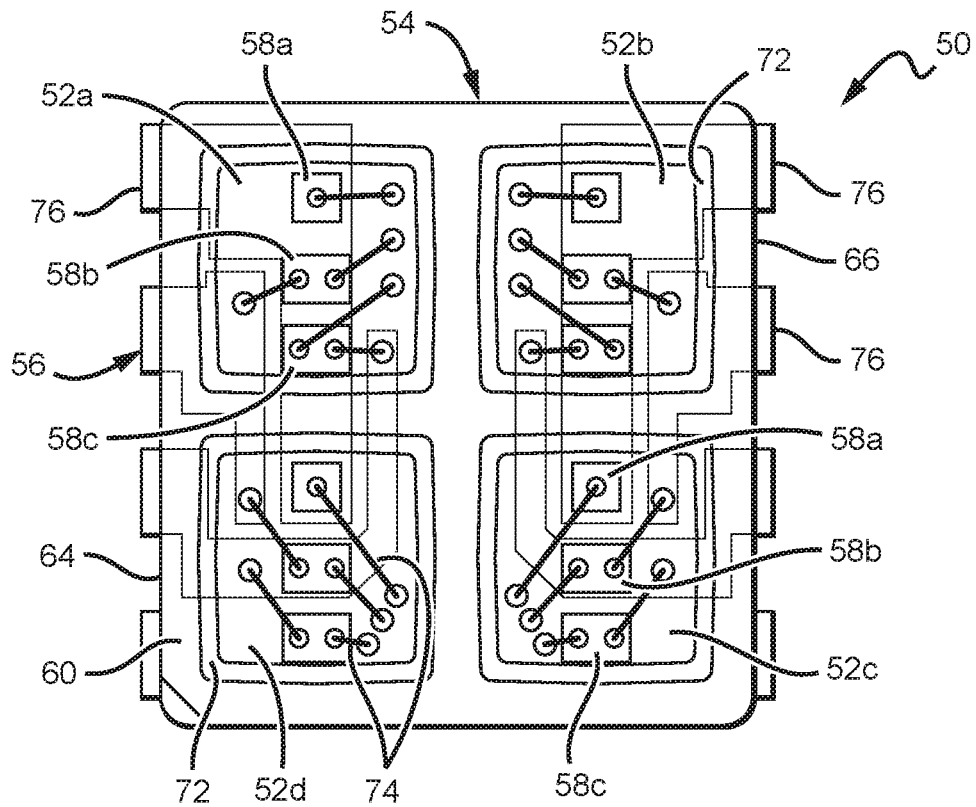
FIG. 7 is a plan view of one embodiment of an LED display according to the present invention.

FIGS. 4-7 show one embodiment of a multiple pixel emitter package 50 according to the present invention, with FIG. 7 in more detail pixel emitters that can be used in some embodiments according to the present invention. The package comprises four pixels 52*a*-*d* arranged in a 2 by 2 format or layout, with the package 50 having a generally square footprint. The package 50 can comprise features for different mounting methods, with the embodiment shown having features to allow for surface mounting. That is, the package 50 comprises a surface mount device (SMD) with a pin and lead frame structure having pin-outs arranged so the package can be mounted to a structure, such as a printed circuit board (PCB), using surface mount technology. As mentioned above, it is understood that the present invention is also applicable to other emitter package types beyond SMDs, such as pin-mounting emitter packages. The package 50 comprises a casing or submount 54 that carries an integral lead frame 56. The lead frame 56 comprising a plurality of electrically conductive connection parts used to conduct an electrical signal to the package's light emitters, and to also assist in dissipating heat generated by the emitters.

The casing or submount ("casing") 54 can be formed of many different materials or combinations of materials, and can have different material in different section. One acceptable casing material is electrically insulating, such as a dielectric material. The casing 54 can comprise at least partially comprise a ceramic such as alumina, aluminum nitride, silicon carbide, or a polymeric material such as polymide and polyester. In some embodiments, the casing 54 can comprise a dielectric material having a relatively high thermal conductivity, such as aluminum nitride and alumina. In other embodiments the submount 54 can comprise a printed circuit board (PCB), sapphire or silicon or any other suitable material, such as T-Clad thermal clad insulated substrate material, available from The Bergquist Company of Chanhassen, Minn. For PCB embodiments different PCB types can be used such as standard FR-4 PCB, metal core PCB, or any other type of printed circuit board.

The lead frame 56 can be arranged in many different ways and different numbers of parts can be utilized in different package embodiments. The pixels can have the same one or more emitters, such as LEDs, and in some embodiments different pixels can have different numbers of LEDs. As best shown in FIG. 7, the package 50 can comprise three LEDs 58a-c per pixel, and in the embodiment shown the lead frame 56 is arranged to apply an electrical signal to the LEDs 58a-c. The lead frame 56 comprises electrically conductive parts for conducting an electrical signal from the package mounting surface (e.g. PCB) to the LEDs 58a-c. The lead frame can also comprise features that can be included to provide mounting stability for the LEDs and to provide an additional thermal path for dissipating heat from the emitter. The lead frame can also comprise physical features such as holes, cut-outs, etc. to increase the stability and reliability of the package, and in some embodiments to help maintain a watertight seal between components. These different features are described in U.S. patent application Ser. No. 13/192,293 to Chan, et al., entitled Water Resistant Surface Mount Device Package, the entirely of which in incorporated herein by reference.

The fabrication of the lead from 56 may be accomplished by stamping, injection molding, cutting, etching, bending or through other known methods and/or combinations of methods to achieve the desired configurations. For example, the conductive parts can be partially metal stamped (e.g., stamped simultaneously from a single sheet of relevant material), appropriately bent, and fully separated or fully separated following the formation of some or all of the casing.

The lead frame 56 may be made from an electrically conductive metal or metal alloy, such as copper, a copper alloy, and/or other suitable low resistivity, corrosion resistant materials or combinations of materials. As noted, the thermal conductivity of the leads may assist, to some extent, in conducting heat away from the LEDs 58a-c.

The casing 54 can have many different shapes and sizes and in the embodiment shown is generally square or rectangular, with upper and lower surfaces 60 and 62 (best shown in FIGS. 5 and 6), and first and second side surfaces 64 and 66. The upper portion of the casing further comprises for recesses or cavities 72 extending from the upper surface 60 into the body of the casing 54 to the lead frame 56. The LEDs 58a-c for each pixel are arranged on the lead frame 56 in a respective one of the cavities 72 such that light from the LEDs emits from the package 50 through the cavity 72. Each cavity 72 can have angled side surfaces that form a reflective cup around the LEDs 58a-c to help reflect emitter light out of the package 50. In some embodiments, a reflective insert or ring (not shown) may be positioned and secured along at least a portion of a side surface 74 of the cavity 72. The effectiveness of the reflectivity of the ring and the emission angle of the package can be enhanced by tapering the cavity 72 and the ring is carried therein inwardly toward the interior of the casing. By way of example a reflector angle of about 50 degrees provides for a suitable reflectivity and viewing angle.

In some embodiments, the cavities 72 may be at least partially filled with a fill material (or encapsulant) that can protect and positionally stabilize the lead frame 56 and the LED 58a-c. In some instances, the fill material may cover the emitters and the portions of the lead frame 56 exposed through the cavities 72. The fill material may be selected to have predetermined optical properties so as to enhance the projection of light from the LEDs, and in some embodiments is substantially transparent to the light emitted by the package's emitters. The fill material can also be flat so that it is approximately the same level as the upper surface 60, or it can be shaped in a lens, such as hemispheric or bullet shape. Alternatively, the fill material can be fully or partially concave in one or more of the cavities 72. The fill material may be formed from a resin, an epoxy, a thermoplastic polycondensate, glass, and/or other suitable materials or combinations of materials. In some embodiments, materials may be added to the fill material to enhance the emission, absorption and/or dispersion of light to and/or from the LEDs.

The casing 54 may be fabricated of material that is preferably both electrically insulating and thermally conductive. Such materials are well-known in the art and may include, without limitation, certain ceramics, resins, epoxies, thermoplastic, polycondensates (e.g., a polyphthalamide (PPA)), and glass. The package 50 and its casing 54 may be formed and/or assembled through any one of a variety of known methods as is known in the art. For example, the casing 54 may be formed or molded around the lead frame, such as by injection molding. Alternatively, the casing may be formed in sections, for example, top and bottom sections with conductive parts formed on the bottom section. The top and bottom sections can then be bonded together using known methods and materials, such as by an epoxy, adhesive or other suitable joinder material.

Packages according to the present invention can use many different emitters, with the package 50 utilizing LEDs 58a-c. Different embodiments can have different LED chips that emit different colors of light, and in the embodiment shown, each pixel in the package 50 comprises a red, green and blue emitting LED chips that can produce a combined color emission of many different wavelengths including white light.

LED chip structures, features, and their fabrication and operation are generally known in the art and only briefly discussed herein. LED chips can have many different semiconductor layers arranged in different ways and can emit different colors. The layers of the LED chips can be fabricated using known processes, with a suitable process being fabrication using metal organic chemical vapor deposition (MOCVD). The layers of the LED chips generally comprise an active layer/region sandwiched between first and second oppositely doped epitaxial layers, all of which are formed successively on a growth substrate or wafer. LED chips formed on a wafer can be singulated and used in different applications, such as mounting in a package. It is understood that the growth substrate/wafer can remain as part of the final singulated LED chip or the growth substrate can be fully or partially removed.

It is also understood that additional layers and elements can also be included in the LED chips, including but not limited to buffer, nucleation, contact and current spreading layers as well as light extraction layers and elements. The active region can comprise single quantum well (SQW), multiple quantum well (MQW), double heterostructure or super lattice structures.

The active region and doped layers may be fabricated from different material systems, with one such system being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the doped layers are gallium nitride (GaN) and the active region is InGaN. In alternative embodiments the doped layers may be AlGaN, aluminum gallium arsenide (AlGaAs) or aluminum gallium indium arsenide phosphide (AlGaInAsP) or aluminum indium gallium phosphide (AlInGaP) or zinc oxide (ZnO).

The growth substrate/wafer can be made of many materials such as silicon, glass, sapphire, silicon carbide, aluminum nitride (AlN), gallium nitride (GaN), with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022. LEDs can also comprise additional features such as conductive current spreading structures and current spreading layers all of which can be made of known materials deposited using known methods.

The LEDs 58a-c may be mounted to and electrically coupled to the led frame 56 by means of an electrically and thermally conductive bonding material such as a solder, adhesive, coating, film, encapsulant, paste, grease and/or other suitable material. In a preferred embodiment, the LEDs may be electrically coupled and secured to their respective pads using a solder pad on the bottom of the LEDs such that the solder is not visible from the top. Wire bonds 74 (shown in FIG. 7) can be included running between the LEDs 58a-c and the lead frame 56.

Figure 8:
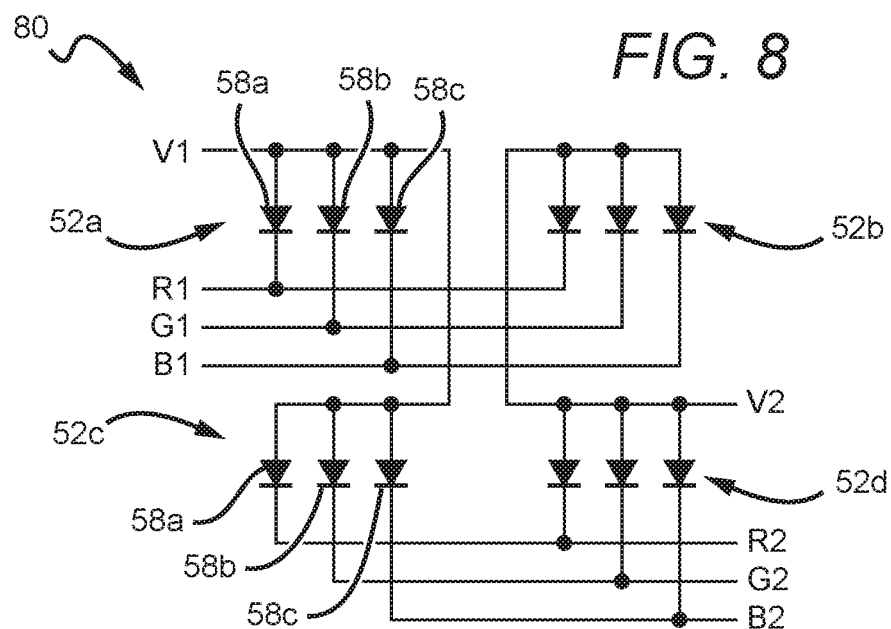
FIG. 8 is a schematic showing the interconnections between the LEDs in one LED package according to the present invention.

The different embodiments of the present invention can have different pin-out arrangement that can depend on different factors such as the number of LEDs, the interconnection of the LEDs, and the level of separate and independent control over each of the pixels and/or each of the LEDs in the pixels. FIG. 7 shows the package 50 with 8 pins 76 in its pin-out structure, and FIG. 8 shows one embodiment of the interconnections structure 80 according to the present invention that can be utilized with an 8-pin pin-out. The interconnections 80 show the four pixels 52a-d, each comprising three LEDs 58a-c, and the electrical connections between the LEDs 58a-c can be provided by the lead frame 56 and/or wire bonds 74 shown in FIG. 7. The electrical signals on pins V1 and V2 provide power to drive the LEDs, with V1 driving the first and third pixels 52a, 52c and V2 driving the other two pixels 52b, 52d. The electrical signal on pins R1, G1 and B1 control emission of the LEDs 58a-c in the first two pixels 52a, 52b and the signal R2, G2 and B2 controlling emission of LEDs 58a-c in the second pixels 52c, 52d. This arrangement allows for dynamic control of pixels 52a-d, each pixel being controlled by a respective combination of the drive and control signals. In the embodiment shown, V1, R1, G1, and B1 control emission of the first pixels 52a and V1, R2, G2 and B2 control emission third pixel 52c. Similarly, V2, R1, G1, and B1 control emission of the second pixel 52b and V2, R2, G2 and B2 control emission fourth pixel 52d.

Figure 9:
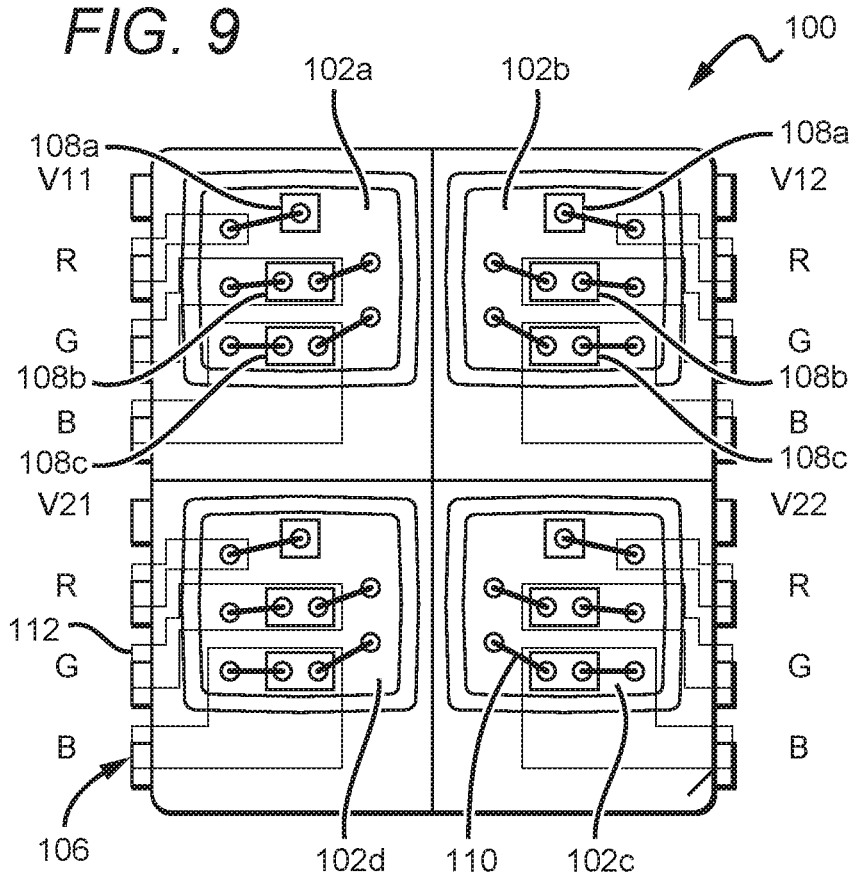
FIG. 9 is a plan view of another embodiment of an LED package according to the present invention.

It is understood that different packages can have different number of pins in their pin-out structures and that the pixels and LEDs can be interconnected in many different ways be different lead frame structures and wire bonds. FIG. 9 shows another embodiment of LED package 100 according to the present invention that also has four pixels 102a-d in a 2 by 2 layout. The package further comprises a casing 104 and lead frame 106, each of which can be manufactured using the same methods and materials as described above. Each of the pixels 102a-d can also comprise one or more LEDs, with the embodiments shown comprising three LEDs 108a-c similar to those described above. The package 100 can also comprise wire bonds 110 to provide electrical connections between the lead frame 106 and the LEDs 108 a-c in the pixels 102a-d.

Figure 10:
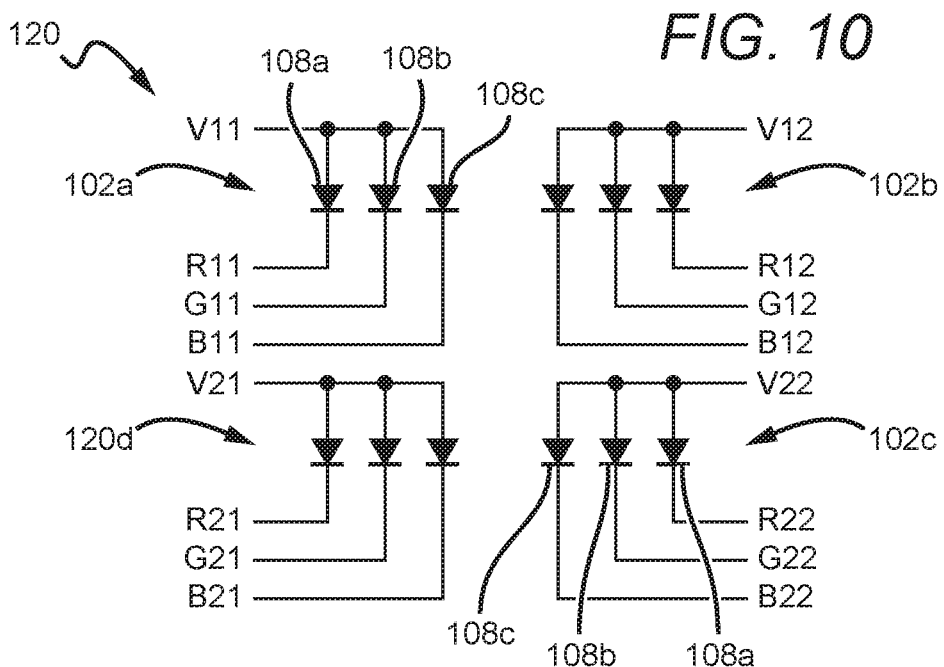
FIG. 10 is a schematic showing the interconnections between the LEDs in another LED package according to the present invention.

The package 100 also comprises a pin-out structure with 16 pins 112, and FIG. 10 shows one embodiment of an interconnection structure 120 according to the present invention that can be used with a structure having 16 pins 112 and four pixels as in the embodiment of FIG. 9. The interconnection structure 120 is provided by the lead frame 106 and wire bonds 110, and allows for discrete control of the pixels 102a-d. That is, each of the pixels 102a-d has its pin to provide a respective power signal and own set of pins to provide control over emission of the LEDs 108a-c in its pixel. For pixel 102a, the power signal can be provided on pin V11, with the signals to control emission of the LEDs 108a-c provided on pins R11, G11, and B11. For pixel 102b, power is provided on V12 and LED control is provided on pins R12, G12 and B12. Power and control is similarly provided to pixel 102c by V22, R22, G22 and B22, and power and control is provided to pixel 102d by V21, R21, G21 and B21. This arrangement requires more pins 112 compared to package 50 described above, but allows for respective control over the emission of each of the pixels 102a-d. These are only two of the many different pin-out and interconnections structures that can be provided by packages according to the present invention.

Figure 11:
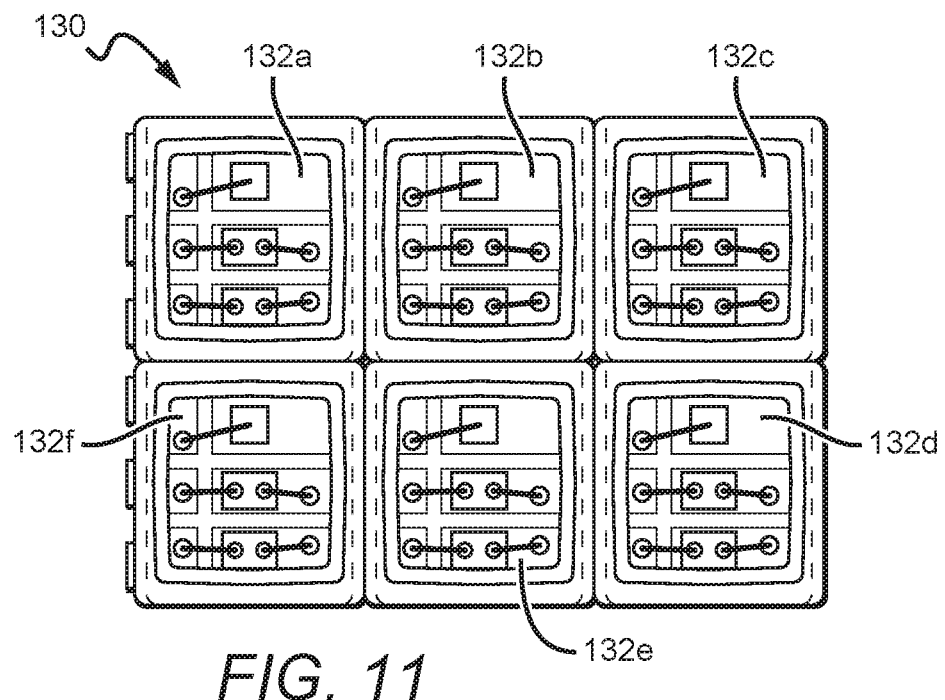
FIG. 11 is a plan view of another embodiment of an LED package according to the present invention.
Figure 12:
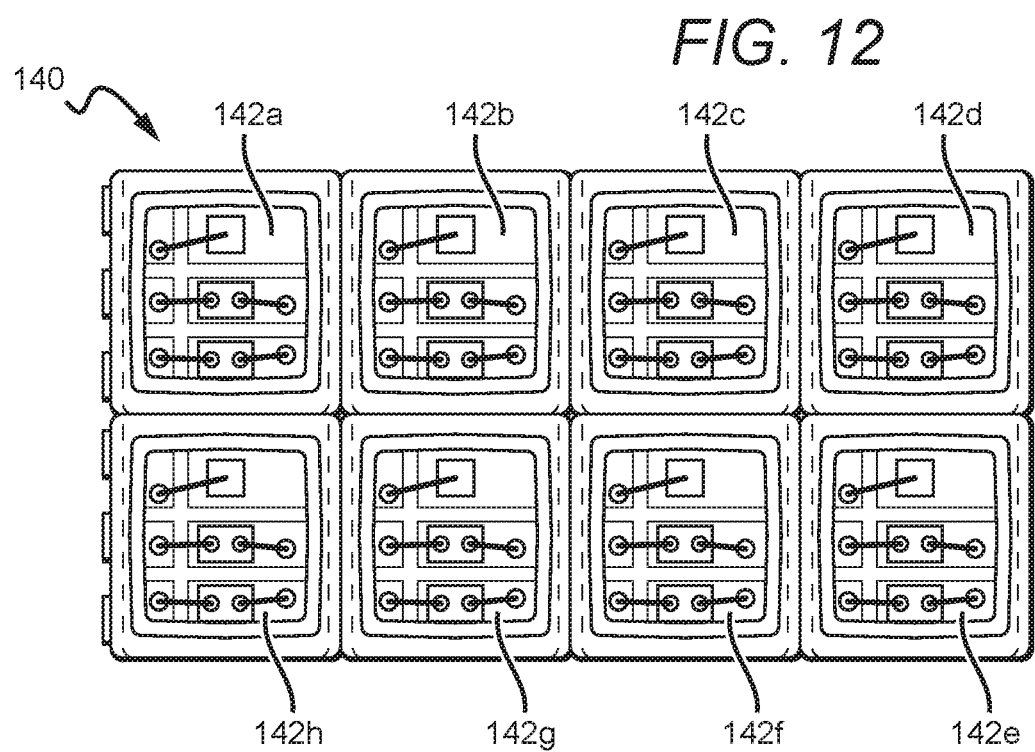
FIG. 12 is a plan view of another embodiment of an LED package according to the present invention.

As discussed above, the packages according to the present invention can be provided with many different matrix layouts beyond those the 2 by 2 layouts shown in packages 50 and 100. FIG. 11 shows another embodiment of a package 130 having six pixels 132a-f arranged in a 2 by 3 matrix layout. FIG. 12 shows another embodiment of a package 140 having eight pixels 142a-h arranged in 2 by 4 matrix layout. Each of the packages 130, 140 comprises a casing, with lead frame, pins and wire bonds similar to those described above but arranged to accommodate a greater number of pixels. Each pixel can also comprise a different number of LEDs, with the pixels shown having three LEDs as described above.

Figure 13:
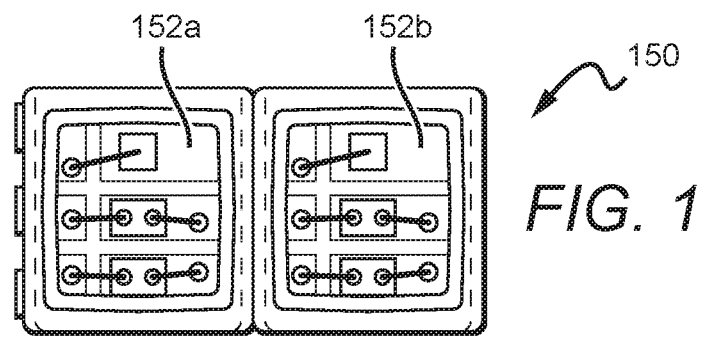
FIG. 13 is a plan view of another embodiment of an LED package according to the present invention.
Figure 14:
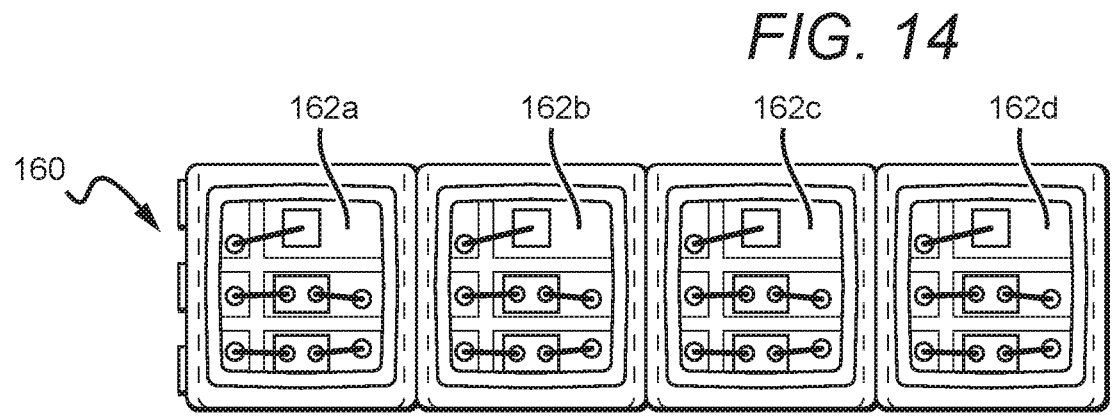
FIG. 14 is a plan view of still another embodiment of an LED package according to the present invention.

The LED packages according to the present invention can also be provided in an array or linear layout. FIG. 13 shows another embodiment of an LED package 150 according to the present invention having two pixels 152a-b arranged in a 2 by 1 linear format. FIG. 14 shows still another embodiment of an LED package 160 according to the present invention having four pixels 162a-d arranged in a 4 by 1 linear format. Each of the packages also comprises the casing, lead frame, pins and wire bonds as described above, and each pixel can comprise LEDs as described above.

Figure 15:
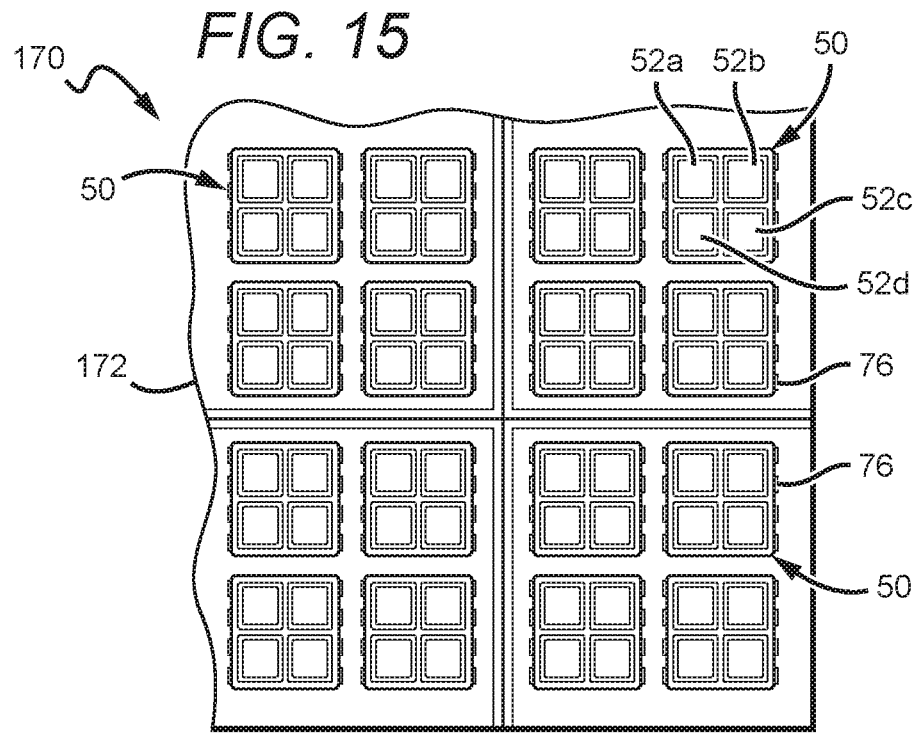
FIG. 15 is a plan view of one embodiment of an LED display according to the present invention.

Multiple ones of the LED packages described above can be mounted together to form a display, with different sized displays having different numbers of packages. FIG. 15 shows a portion of a display 170 having 16 of the 2 by 2 LED packages 50 described above, surface mounted to display panel 172. The packages 50 have eight pins 76 and the panel 172 can comprise the interconnections to allow for dynamic driving of the pixels 52*a-d* in each package 50 as described above. The panel can comprise many different structures arranged in many different ways, with one embodiment at least partially comprising a printed circuit board (PCB) having conductive traces, with the packages surface mounted in electrical contact with the traces. It is understood that typical displays would have many more packages to form the display, with some displays having enough packages to provide hundreds of thousands of pixels.

Figure 16:
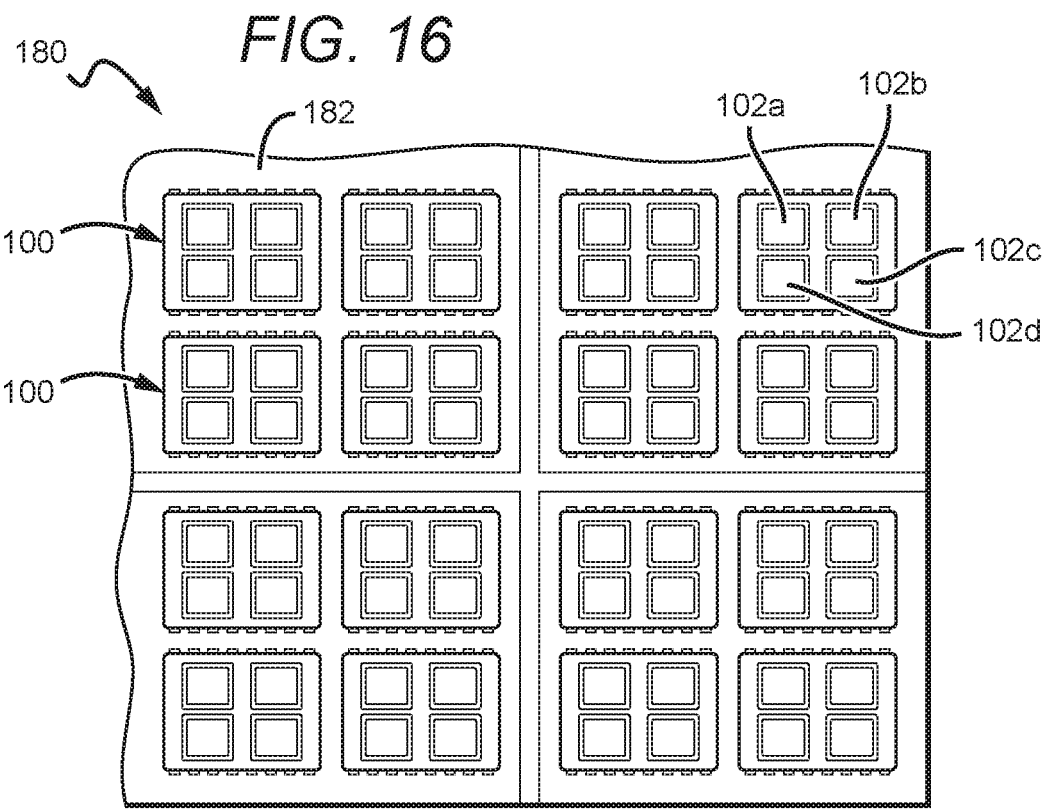
FIG. 16 is a plan view of another embodiment of an LED display according to the present invention.
Figure 17:
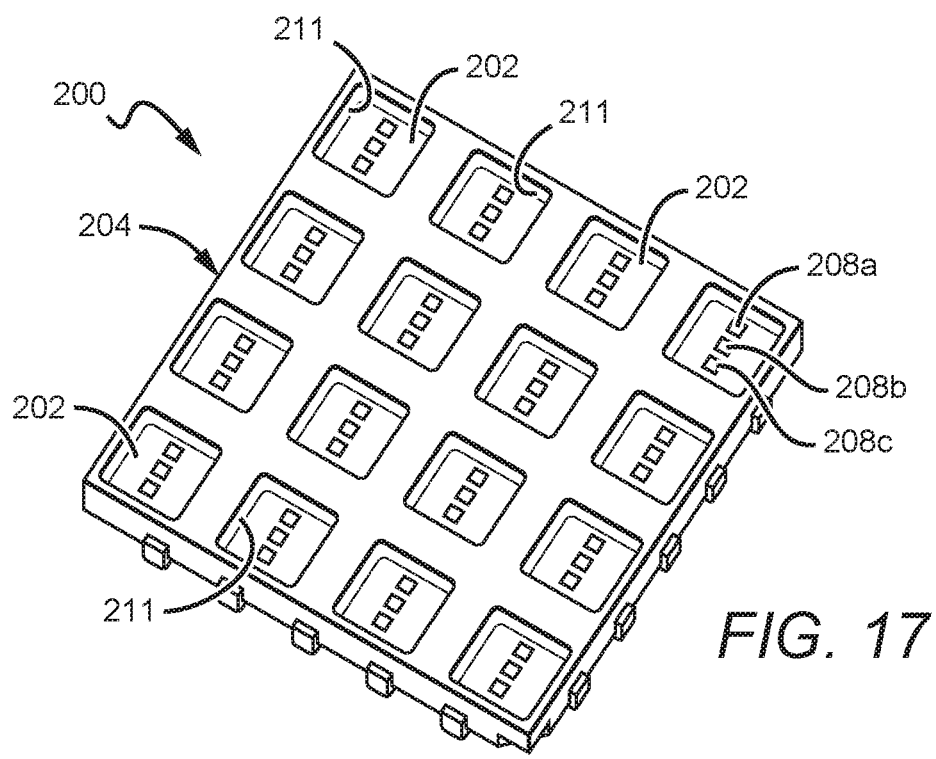
FIG. 17 is a perspective view of another embodiment of and LED package according to the present invention.
Figure 18:
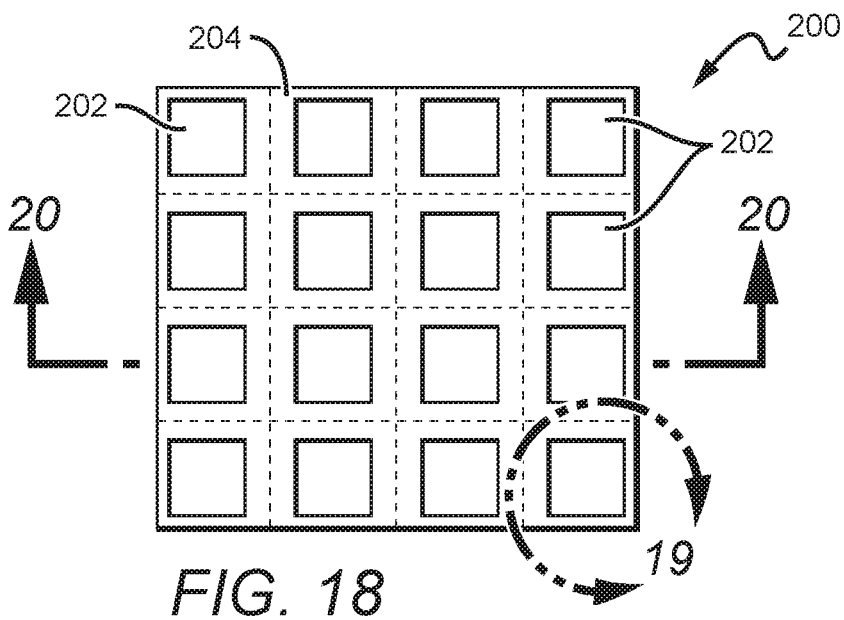
FIG. 18 is a plan view of the LED package shown in FIG. 17 without the LEDs shown in the pixels.
Figure 20:
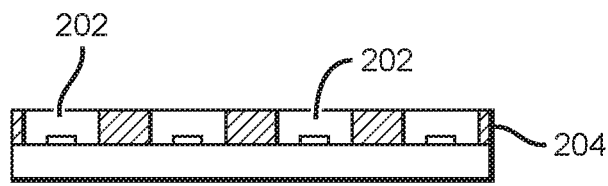
FIG. 20 is a side view of the LED package shown in FIGS. 17 and 18 taken along section lines 20-20.
Figure 19:
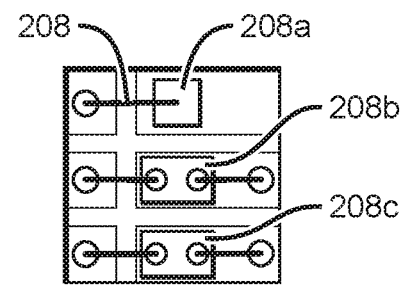
FIG. 19 is a plan view of one of the pixels in the LED package of FIGS. 17 and 18.

The other packages described above can similarly be provided in a display. FIG. 16 shows another portion of a display 180 having 16 of the 2 by 2 LED packages 100 described above, surface mounted to display panel 182. These packages have 16 pins and the panel 182 can comprise the interconnections to allow for discrete driving of the pixels 102*a-d* as described above. The panel 182 can at least partially comprise a PCB with conductive traces, and a full display can also have many more packages 100.

By arranging multiple pixels on a single package, the pixels can be arranged closer to one another (i.e. closer pitch) which can result in an LED display of higher resolution. At the same time, the multiple pixel packages allow for reduced complexity in the LED display compared to using single pixel LED packages. In some embodiments, the LED packages can have a pitch in the range 0.5 to 3.0 millimeters, while in other embodiments the pitch can be in the range of 1.0 to 2.0 millimeters. In still other embodiments, the pitch between pixels can be approximately 1.5 mm.

The packages can also have different sized footprints depending on the number of pixels in the package. For the 2 by 2 LED packages 50, 100 described above the footprint can be square or rectangle with some embodiments having a footprint with the sides being in the range of 2 to 6 millimeter. In other embodiments the sides can be in the range of 3 to 5 millimeters. In some generally square embodiments the sides can be in the range of 3 to 4 millimeters, while in some generally rectangle embodiments, one side can be in the range of 3-4 millimeters, while the other side can be in the range of 4-5 millimeters. It is understood that these are only some of the sizes for the LED packages according to the present invention and that these sizes can increase in proportion to the increased number of pixels in a package.

The different embodiments of LED packages according to the present invention can also comprise square matrix layouts larger than the 2 by 2 matrix layouts described above, including 4 by 4, 5 by 5, 6 by 6, etc. FIGS. 17-22 show another embodiment of an LED package 200 according to the present invention comprising 16 pixels 202 arranged in a 4 by 4 matrix layout. The package 200 can comprise a casing 204, lead frame 206 and wire bonds 208 (shown in FIG. 19), made of the same materials by the same processes as those described above. Each pixel can also comprise one or more LEDs, with the embodiment shown having pixels comprising three LEDs 208*a-c* similar to those described above.

Figure 21:
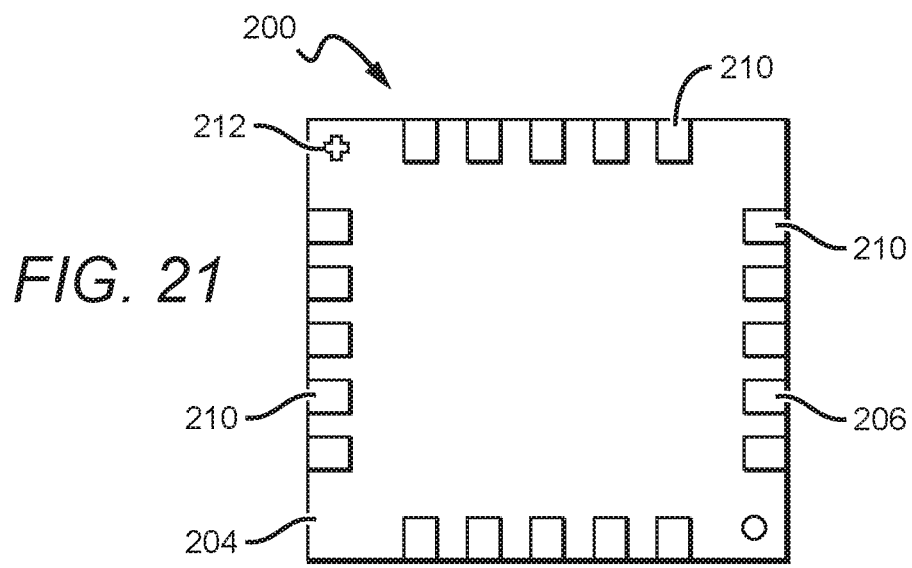
FIG. 21 is a bottom view of the LED package shown in FIGS. 17 and 18.

Different embodiments of the package 200 can have lead frames with different number of pins, with the lead frame and wire bonds interconnecting the LEDs in different ways. In the embodiment shown, lead frame 206 comprises a pin-out structure having 20 pins 210 as best shown in FIGS. 21 and 22. The pins 210 run from the side surface of the package and are bent underneath the casing 204 to provide for convenient surface mounting, such as to a display panel. The bottom surface of the package 200 can also comprise polarity indicators that can be used by pick and place machines to mount the packages in the proper orientation. Referring now to FIG. 21 a "+" shaped polarity indicator 212 is provided in a corner of the package 200, but is understood that the polarity indicators can take many different shapes and can be in many different locations. For example, FIG. 22 provides a triangle shaped polarity indicator 214 in a different corner of the package 200.

Figure 24:
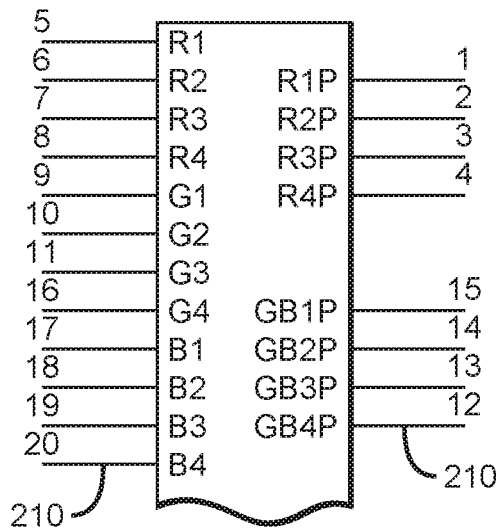
FIG. 24 is a schematic of one embodiment of the pin designations in one embodiment of an LED package according to the present invention.

Referring now to FIG. 23 the 20 pins 210 are numbered 1-20 around the perimeter of the package. FIG. 24 shows the function performed by the electrical signal provided on the different pins 210. Pins 1-4 are designated R1P, R2P, R3P and R4P, with each providing power to the red LEDs in four of the pixels. Pins 12-15 are designated GB1P, GB2P, GB3P and GB4P, with each providing power to the green and blue LEDs in four of the pixels. Pins 5-8 are designated R1, R2, R3 and R4, with each controlling the emission of red LEDs in four of the pixels. Similarly, pins 9-11 and 16 are designated G1, G2, G3 and G4, with each controlling the emission of green LEDs in four of the pixels. Finally, pins 17-20 are designated B1, B2, B3 and B4, with each controlling the emission of blue LEDs in four of the pixels.

Figure 25:
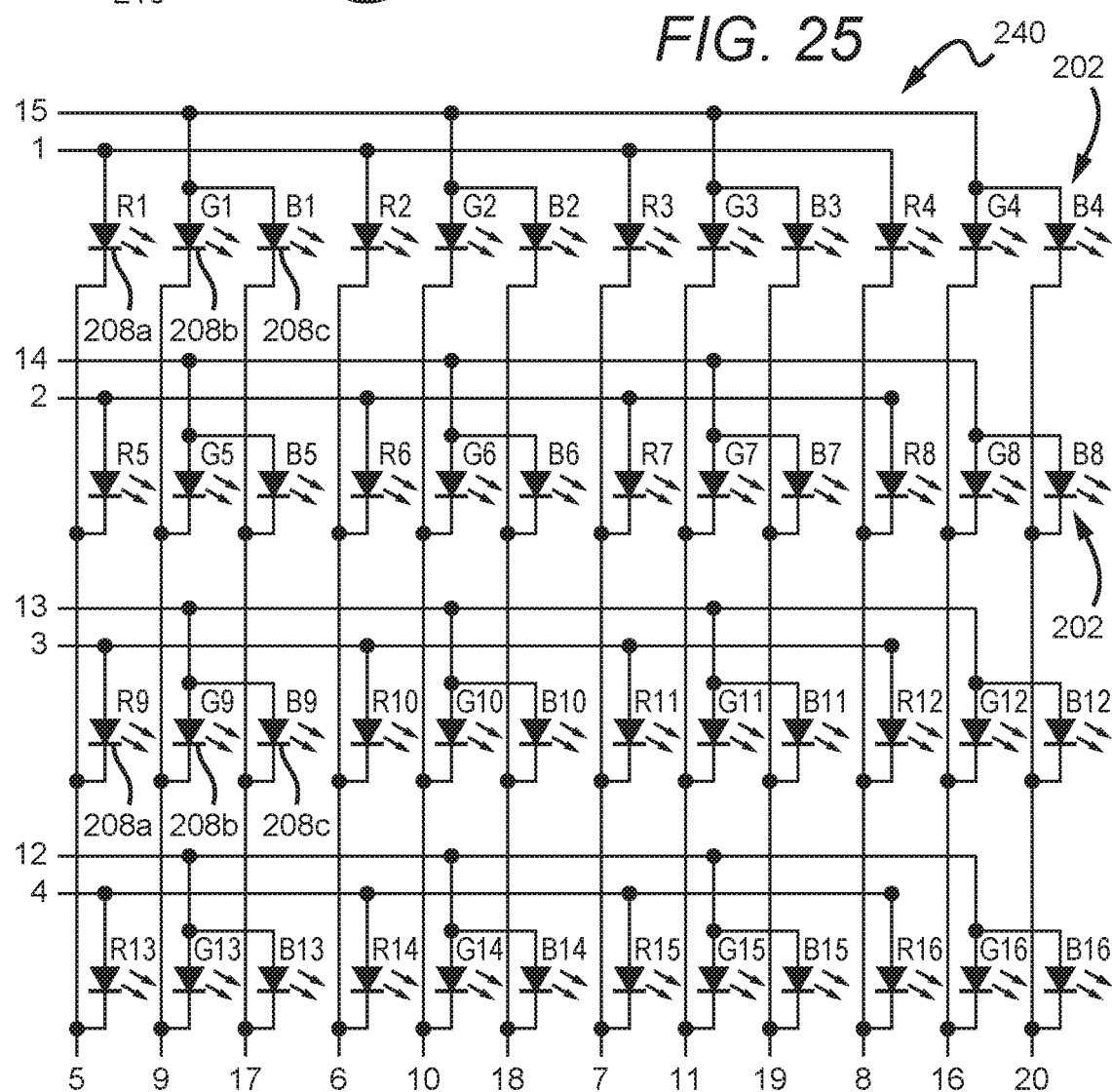
FIG. 25 is a schematic showing the interconnections between the LEDs in on LED package according to the present invention utilizing the pin designations shown in FIG. 24.

FIG. 25 shows one embodiment of the interconnections 240 between the LEDs in the different pixels when utilizing the pin out designations shown in FIG. 24. The each electrical signal applied to pins 1-4 (R1P-R4P) applies power to the red LEDs 208*a* in a respective row of pixels 202, while the signal applied to pins 5-8 controls emission of the red LEDs 208*a* in a column of pixels 202. This row and column arrangement allows for controlling the emission of individual red LEDs. For example, the emission of the red LED R8 in the second row and second column can be controlled by the electrical signals applied to pin 2 (R2P) and pin 6 (R2).

A similar approach can be used for controlling illumination of the green and blue LEDs 208*b*, 208*c*. The electrical signal applied to pins 12-15 (GB1P-GB4P) applies power to the green and blue LEDs 208*b*, 208*c* in a respective row of pixels 202. The signal applied to pins 9-11 and 16 (G1-G4) controls emission of the green LEDs 208*b* in a respective column of pixels 202, and the signal applied to pins 17-20 (B1-B4) controls emission of the blue LED 208*c* in a respective column of pixels 202. This row and column arrangement allows for controlling the emission of individual green and blue. For example, the emission of the green LED G8 in the pixel in the second row and second column can be controlled by the electrical signals applied to pin 14 (GB2P) and pin 10 (G2). The emission of the blue LED B8 in the pixel in the second row and second column can be controlled by the electrical signals also applied to pin (GB2P) and pin 18 (B2). This interconnect arrangement is only one of the many that can used in embodiments according to the present invention.

Figure 26:
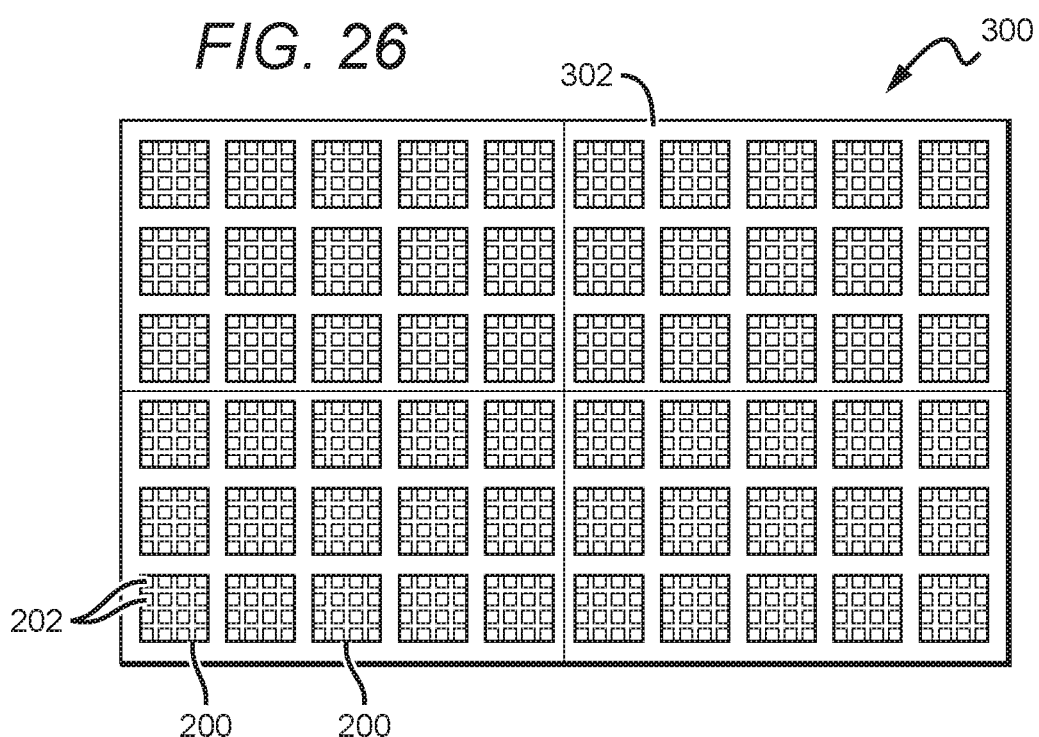
FIG. 26 is a plan view of another embodiment of an LED display according to the present invention.

As with the packages described above, multiple ones of the 4 by 4 LED packages can be mounted together to form a display, with different sized displays having different numbers of packages. FIG. 26 shows one embodiment of a display or a portion of a display 300 having 60 of the 4 by 4 packages 200 mounted to a display panel 302 in a 6 by 10 layout. The panel 302 can comprise the interconnections for the 20 pin pin-out structure for the packages 200 to allow for driving of the pixels 202. The panel 302 can comprise many different structures arranged in many different ways, with one embodiment at least partially comprising a printed circuit board (PCB) having conductive traces, with the packages surface mounted in electrical contact with the traces.

Figure 27:
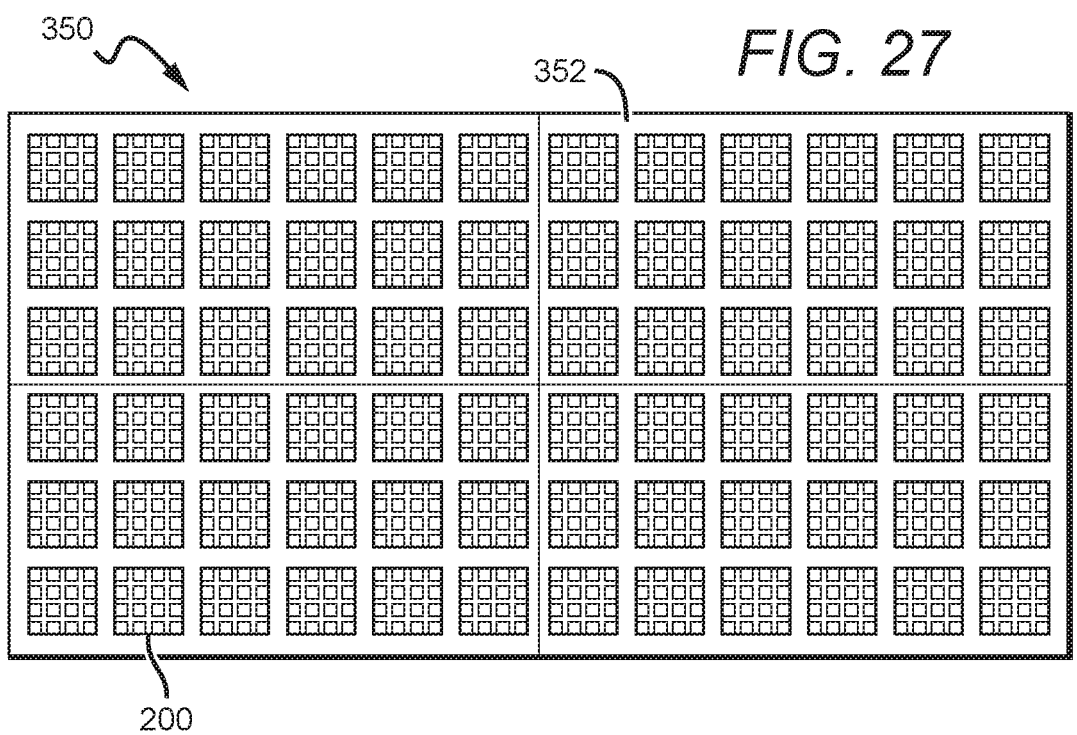
FIG. 27 is a plan view of another embodiment of an LED display according to the present invention.

FIG. 27 shows another embodiment of a display 350 having 70 of the 4 by 4 LED packages mounted on a display panel 352 in a 6 by 12 arrangement. The panel 352 can comprise the interconnections for the 20 pin pin-out structure for the packages 200 to allow for driving of the pixels 202. It is understood that typical displays would have many more packages to form the display, with some displays having enough packages to provide hundreds of thousands of pixels.

Referring again to FIG. 17, the package 200 can be arranged such that the upper surface of the casing 204 has a color that contrasts with that of the light emitted from the package 200 through the recess/cavity 211. In most embodiments, light emitted from the cavity 211 can comprise a combination of light emitted by the LEDs 208a-c. In some embodiments, the LEDs can emit a white light and the upper surface of the casing can comprise a color that contrasts with white light. Many different colors can be used such as blue, brown, grey, red, green, purple, etc., with the embodiment shown having a black color on its upper surface. The black coloring can be applied using many different known methods. It can be applied during molding of the casing 204, or can be applied at a later step in the package fabrication process using different methods such as screen printing, ink jet printing, painting, etc. LED packages with contrasting faces are described in U.S. patent application Ser. No. 12/875,873 to Chan, et al., entitled LED Package With Contrasting Face, the entirely of which in incorporated herein by reference.

Figure 28:
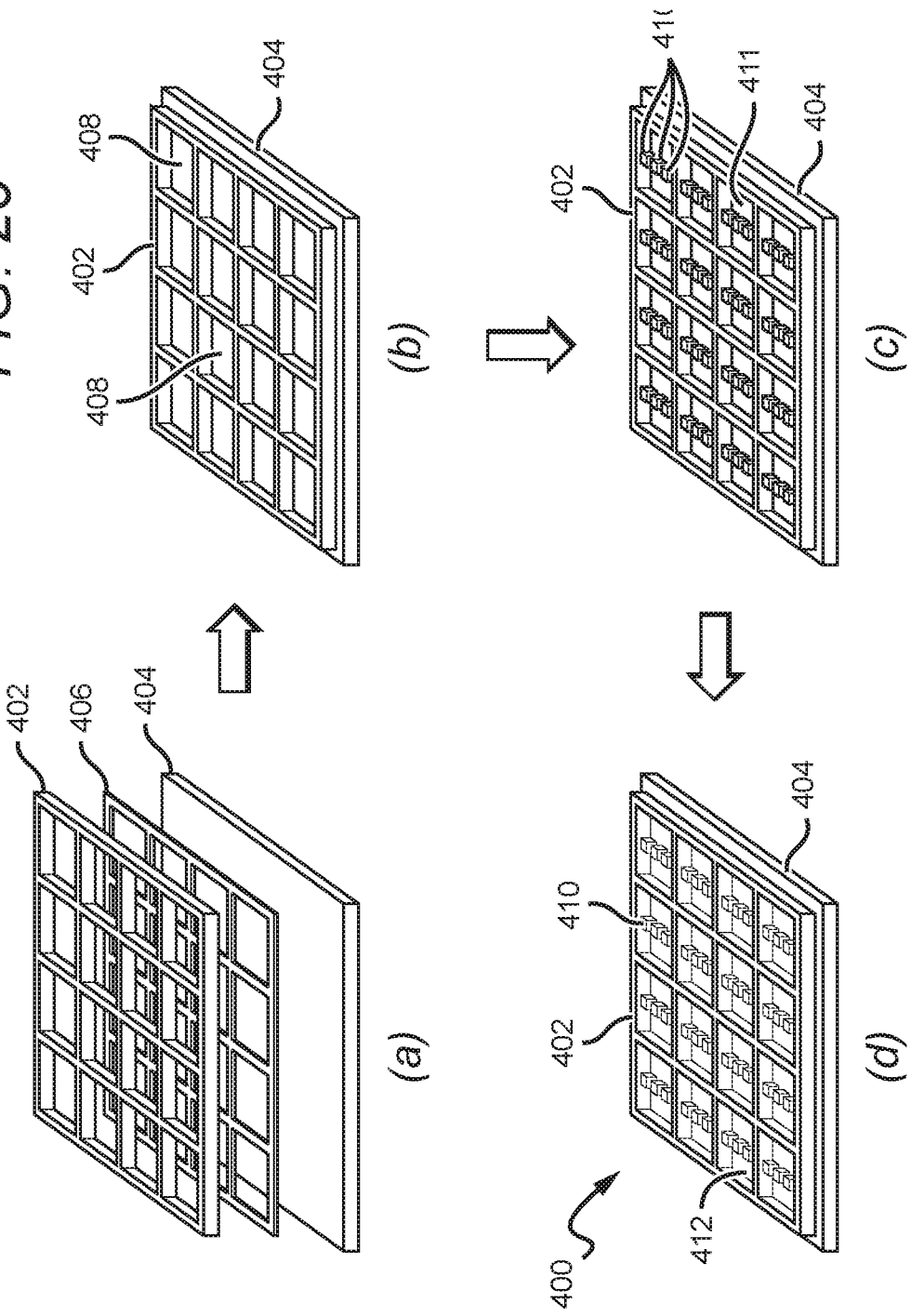
FIGS. 28a-d show a method for fabricating an emitter panel according to an embodiment of the present invention.

FIGS. 28a-d show a method of fabricating an emitter panel. In FIGS. 28a and 28b a barrier 402 is affixed to a submount 404 using an adhesive 406 such that the barrier 40 is on and above the submount 404. Because material is added to the submount 404, this pixel area array is created with an additive process. The barrier 402 is aligned on the submount 404 to define a plurality of cavities that function as pixel areas 408. Then, as shown in FIG. 28c, at least one light emitter 410 is mounted in each of the pixel areas 408 on a mount surface 411. In this embodiment, three LEDs (one red, one green, and one blue) are mounted to the mount surface 411 in the pixel area 408. Finally, in FIG. 28d the cavities of the barrier 402 are filled with a material to provide an encapsulant 412 that at least partially covers the emitters 410 in the pixel area 408. In this embodiment, the barrier 402 is a mask this is mounted on a mounting surface of the submount 404. A mask can be fabricated from many different materials, including PPA and PCB, for example. In another embodiment, the barrier 402 can be formed from a molded encapsulant that is affixed to the submount mounting surface 411. In yet another embodiment, the barrier 402 can be formed by forming recesses in the submount such that the mounting surface is sunken into the submount and the barrier is above the mounting surface.

Figure 29:
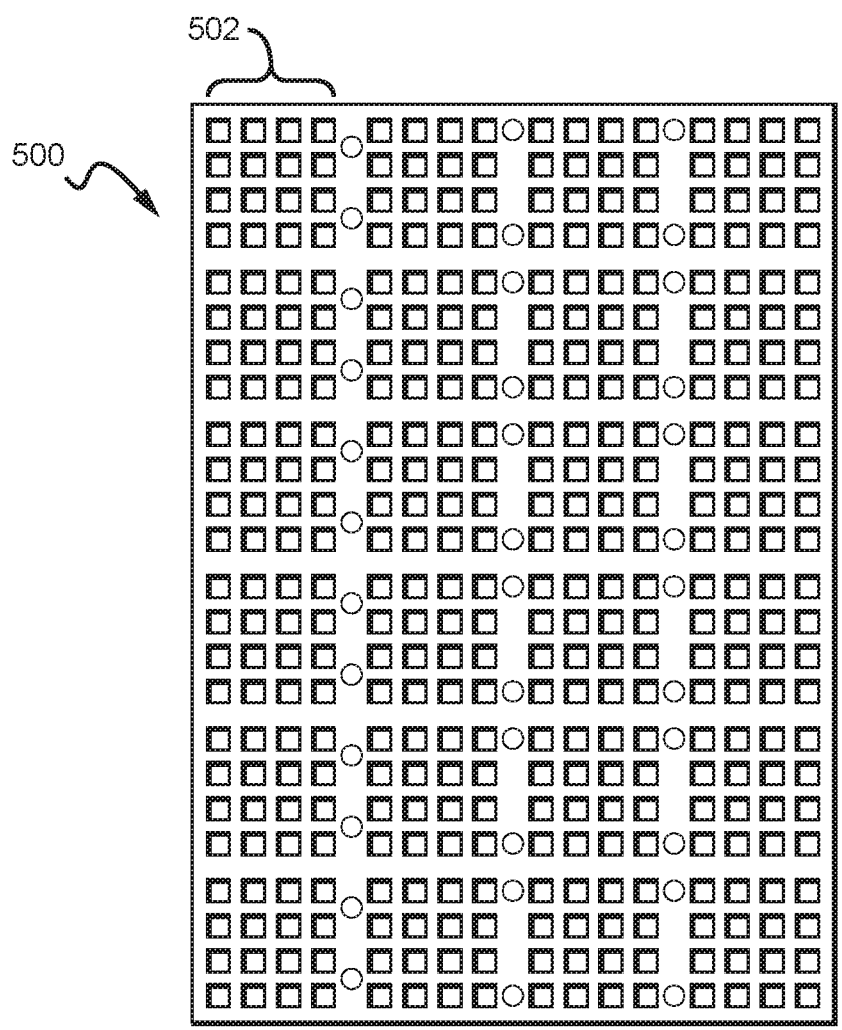
FIG. 29 is a top plan view of an emitter panel according to an embodiment of the present invention.

FIG. 29 is a top plan view of a mask 500 that may be incorporated into emitter panels. The mask 500 has square holes cut into it that will define the pixel areas when the mask 500 is affixed to a submount. Square holes are used because they offer the most space-efficient window for the pixels. In some cases, if a drill is used to create the holes, the corners of the holes may be rounded. In this particular embodiment, the mask 500 comprises a 6×4 array of 4×4 base modules 502 for a total of 384 pixel holes. It is understood that more or fewer base modules 502 may be used to provide the desired array size and that base modules in arrays other than 4×4 may also be used. As noted herein, a PPA is one suitable material may be used to make the mask 500. Other materials such as polymers may also be used. The mask 500 can be fabricated using many different methods such as molding, stamping, or drilling, for example. Materials and fabrication methods should be chosen to provide a mask 500 that will not deform, has good thermal stability, adheres well to silicone/epoxy, has a similar coefficient of thermal expansion (CTE) as the submount to which it will be affixed, good hardness with reasonable elongation, and, preferably, a non-glossy surface.

Again with reference to FIG. 28, the barrier 402 (a mask, in this embodiment) may be attached to the submount 404 with an adhesive. In one embodiment, a liquid phase glue may be used. A stencil can be applied and used in conjunction with a high-viscosity glue that may be controlled. It is also possible to use various writing methods to apply the glue. In other embodiments, a solid phase glue may be suitable, in which case a stamping mold may be used to form the glue into a solid grid (matching the shape of the barrier 402) to be applied to the mounting surface 411 of the submount 404. Solid state glues may also be shaped at the same time with the barrier, reducing process time and improving alignment. Many different glues will suffice. Suitable glues will adhere well to both the barrier 402 and the submount 404 and will bleed minimally after curing. Preferably, the glue will have good thermal/UV stability. In some embodiments it will be advantageous to use a b-staging process with the solid phase glue. B-staging is known in the art and describes a process that utilizes heat or UV light to remove the majority of solvent from an adhesive, thereby allowing construction to be staged. That is, in between adhesive application, assembly, and curing, the mask barrier 402 and submount 404 can be held for a period of time, without having to immediately finish all the fabrication steps. This would, for example, allow intermediate versions of the products to be shipped and assembled in various locations. A room temperature vulcanizing (RTV) material may be used as the adhesive in this process.

Figure 30:
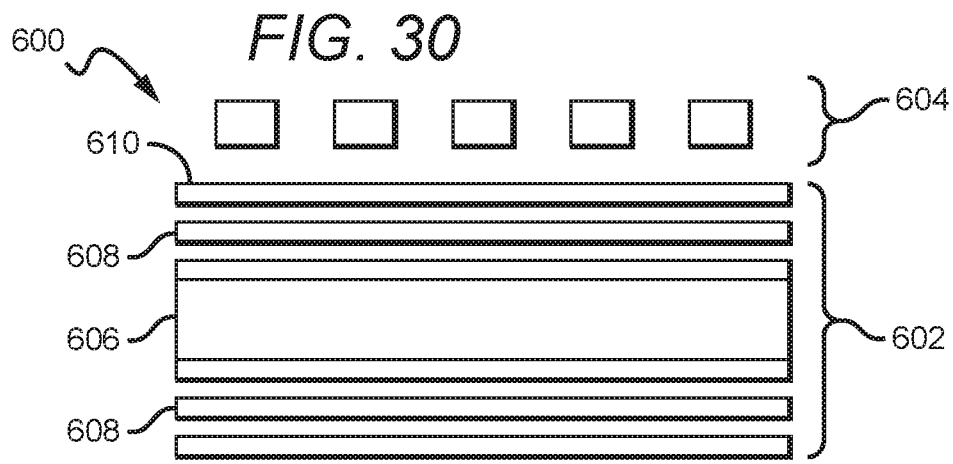
FIG. 30 is a cross-sectional view of a mask/submount combination according to an embodiment of the present invention.

FIG. 30 is a cross-sectional view of another embodiment of a barrier/submount combination 600, where the barrier is a second submount 604 functioning as a mask. In some embodiments, first and second submounts may be used with the barrier being created by mounting the second submount to the first submount. Here, a PCB board is used for the first submount 602, with the top surface being either PCB core material 606 or a pre-preg material 608. Pre-preg materials are known in the art and describe "pre-impregnated" composite fibers where a matrix material, such as epoxy, is already present. The fibers often take the form of a weave, and the matrix is used to bond them together and to other components during manufacture. In this particular embodiment, the second submount 604 is shaped to function as a mask. The mask material may also be PCB core; in other cases it may be a pre-preg material. Using common PCB materials, the second submount 604 can be created at the PCB fabrication facility and attached to a mount surface 610 of the PCB submount 602. Some other suitable subtractive methods that may be used are drilling, ablation (e.g., with a laser), or stamping.

In other embodiments, a barrier is created with a subtractive process (i.e., by removing material) in which material from the top surface of a submount is removed to create a sunken mount surface. The remaining submount material then defines the barrier and, consequently, the pixel areas. Thus, it is possible to provide a raised barrier that defines the pixel area above the mount surface using either an additive process or a subtractive process.

Figure 31:
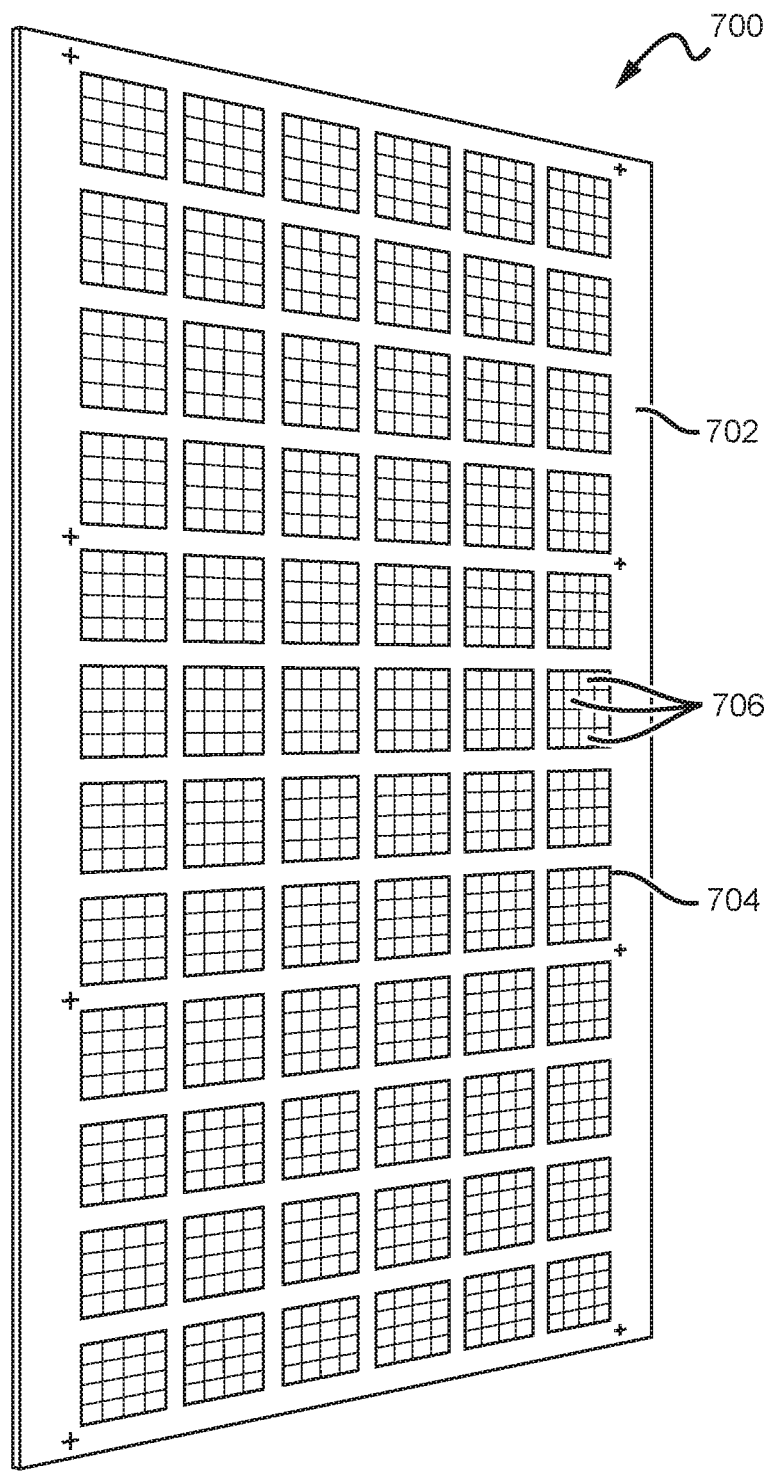
FIG. 31 is a perspective view of an emitter panel according to an embodiment of the present invention.

FIGS. 31-34 show various views of an emitter panel 700: FIG. 31 is a perspective view of the emitter panel 700; FIG. 32 shows a top plan view of the emitter panel 700; FIG. 33 is a close-up view of one 4×4 module 704; and FIG. 34 shows a close-up of an individual pixel 706. The emitter panel 700 comprises a PCB submount 702. Each module 704 comprises sixteen individual pixels 706. The light emitters (not yet included) within each pixel are electrically connected inside the submount 702. PCBs can include internal electrical interconnections that provide power and control signals to pixels 706. Suitable submount materials will have low transparency, good rigidity, a similar CTE to the barrier/mask material, good thermal stability, and good adhesion to silicone/epoxy. The module 700 was fabricated with a PCB submount 702, a PPA mask, and a solid epoxy adhesive.

Figure 35:
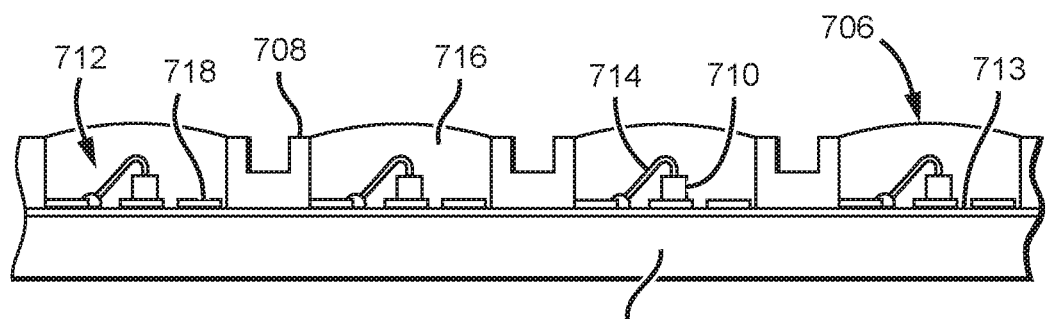
FIG. 35 is a cross-sectional view of an emitter module according to an embodiment of the present invention.

FIG. 35 shows a cross-sectional view of the module 704 with light emitters 710 installed and connected to the submount 702. The mask 708 provides a raised barrier above the mount surface 713 that defines the pixel areas 712. The light emitters 710 are electrically connected to traces 718 on the mount surface 713 of the submount 702 with wire bonds 714. An encapsulant 716 material fills in the pixel area 712 bounded by the mask 708 and covers the light emitters 710 and the wire bonds 714. The encapsulant 716 can perform a dual function; it can both protect the elements within the pixel area 712 and shape the outgoing light from the emitters 710. Encapsulants (preformed or molded on submount) can be designed to function as a lens, providing a particular optical output from the pixels.

Figure 36:
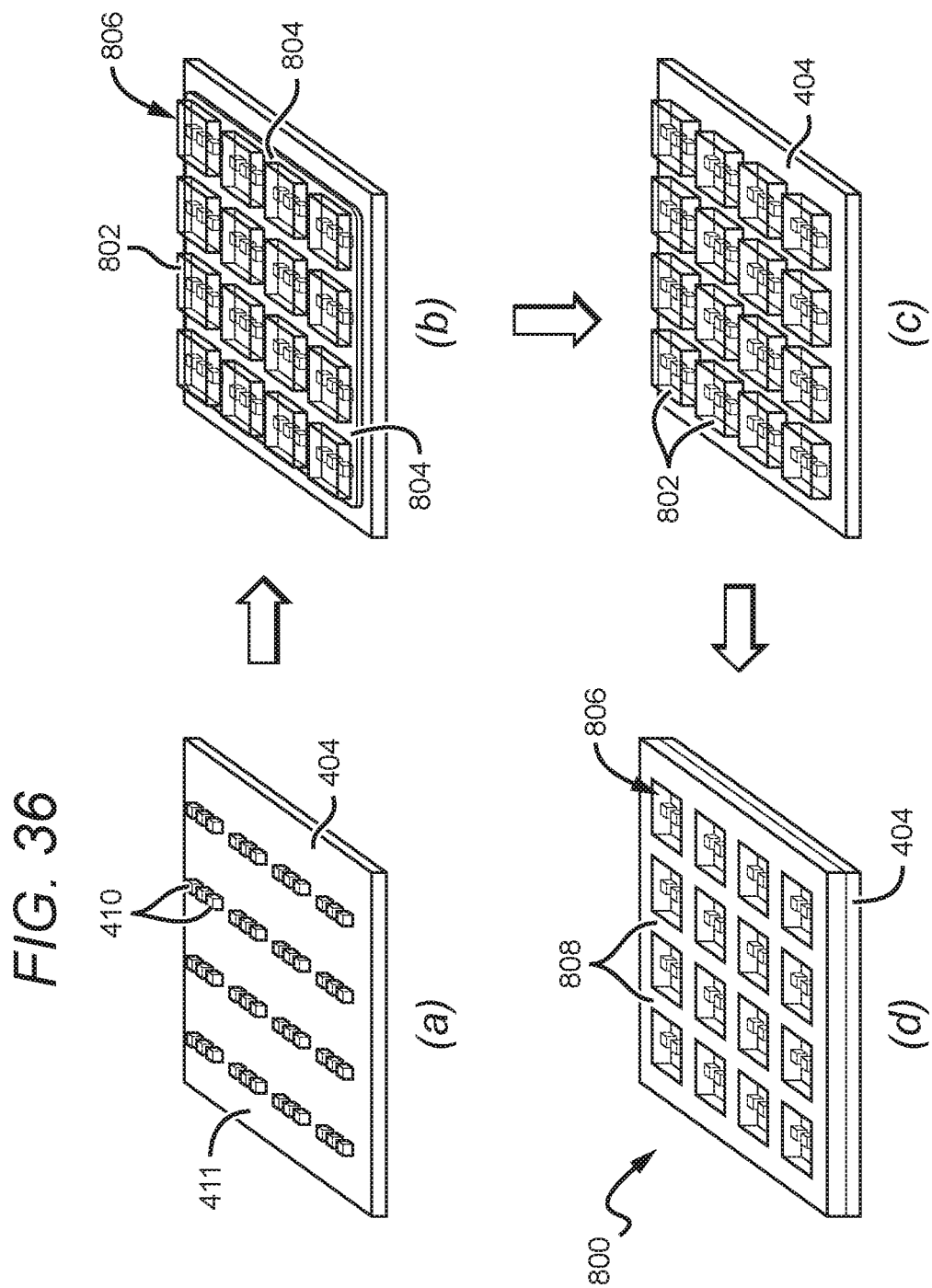
FIG. 36 shows a method for fabricating light emitter panels according to an embodiment of the present invention.

FIGS. 36a-d show another method for fabricating a solid state emitter panel 800. In this embodiment, the light emitters 410 are mounted to the mounting surface 411 of the submount 404 first, as shown in FIG. 36a. Then, as described in FIG. 36b, a monolithic encapsulant 802 is molded over the sources 410 to define the pixels 806. Thus, in this embodiment the barrier is defined by the sidewalls of the encapsulant 802 with the light sources 410 on the mount surface 411 within the barrier. Many additive processes can be used including transfer molding, dispense molding, injection molding, and the like. The encapsulant material should be chosen to provide good light output efficiency, rigidity, uniformity, a compatible CTE with the submount 404, and good adhesion to the submount 404. Suitable materials include epoxy and silicone, for example. As noted previously, the encapsulant may function as a lens with the lensed portions thereof aligning with the pixel areas 806 when the encapsulant 802 is attached to the submount 404.

With reference to FIG. 36b, during the molding step some residual material called "flash" 804 remains on the submount 404 in the regions between the pixels 806. As discussed below, in FIG. 36c the flash 804 is removed from the gaps between the pixels 806. Once the flash 804 is cleared, a filler material 808 can be applied to the submount 404 in the gaps between the pixels 806, as shown in FIG. 36d.

Figure 37:
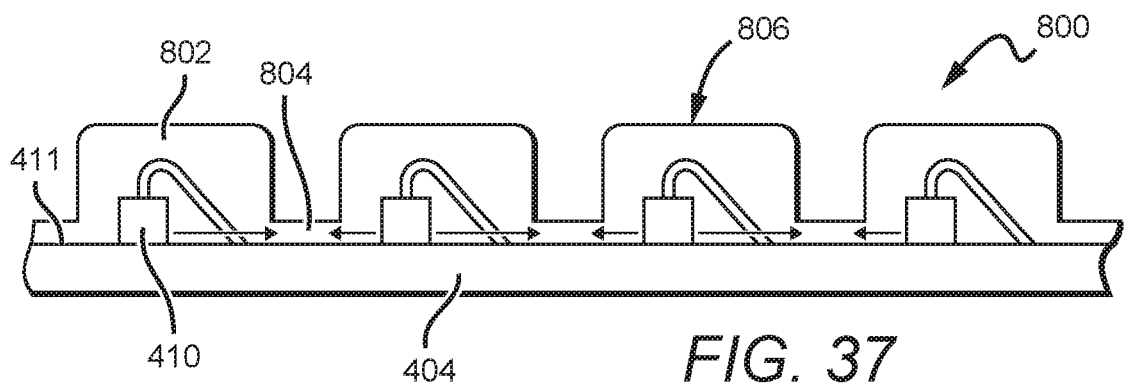
FIG. 37 shows a cross-sectional view of an emitter module during an intermediate fabrication step according to an embodiment of the present invention.

FIG. 37 shows a cross-sectional view of the unfinished module 800 at an intermediate fabrication step (see FIG. 36b) where flash 804 can be seen on the submount mount surface 411 between the pixels 806. In those applications where precision is important, such as in a display, the residual flash 804 is not desirable as it can act as a light guide, transmitting light from the emitters 410 between neighboring pixels 806 (illustrated by the arrows). This effect is called pixel cross-talk and can cause blurring and diminish resolution. In order to minimize cross-talk, the flash 804 should be removed from the surface of the submount 404 between the pixels 806.

The flash 804 can be removed from the submount 404 in different ways. For example, a portion of the flash 804 may be mechanically removed (e.g., with a saw), optically removed (e.g., with a laser), or chemically removed (e.g., with an etch). When removing flash 804, it is important not to cut/burn into the submount 404 below. If a PCB submount is used, it may also be advantageous to design the layout of traces such that they do not run along areas between the pixels 806.

Figure 38:
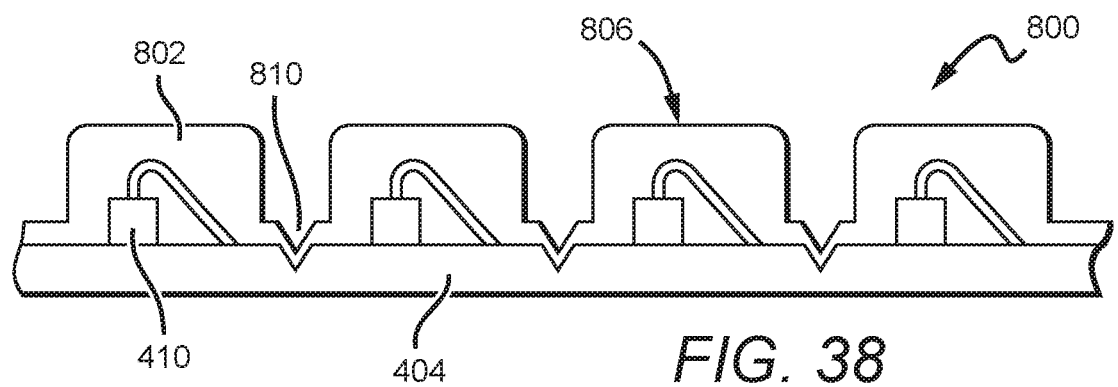
FIG. 38 shows a cross-sectional view of an emitter module during an intermediate fabrication step according to an embodiment of the present invention.

Another method for minimizing the negative effects of pixel cross-talk is to introduce a discontinuity or separator in the light guide pathway (i.e., the flash 804) to disrupt transmission between the pixels 806. For example, as shown in FIG. 38, a v-shaped cut 810 is made into the submount between the pixels 806 prior to adding the encapsulant 802. When the encapsulant 802 is applied, the material coats the v-cut areas. The v-cuts 810 result in an inefficient pathway for the light to travel between the pixels 806, reducing cross-talk. This separator method eliminates the need to remove the flash 804 at all. If a PCB submount is used traces should not run in areas where v-cuts will be applied. It is also necessary to closely control the volume of encapsulant material during application of the encapsulant 802.

Figure 39:
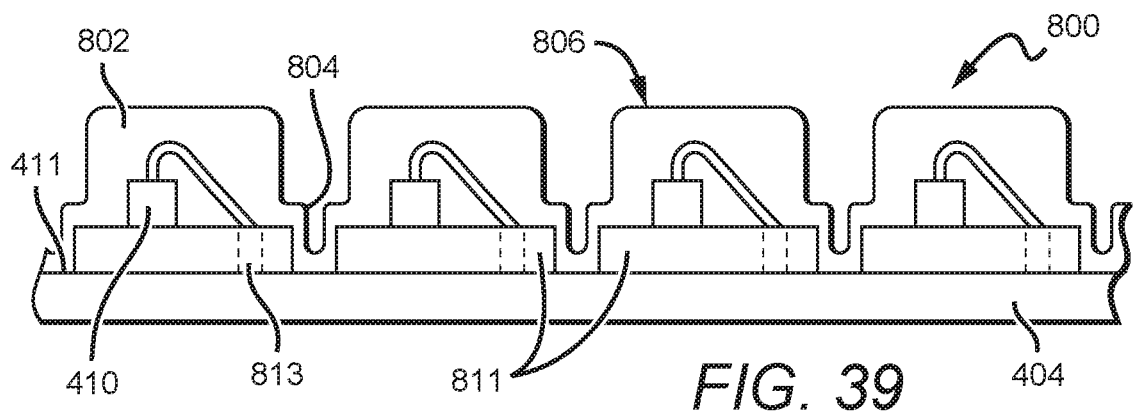
FIG. 39 shows a cross-sectional view of an emitter module during an intermediate fabrication step according to an embodiment of the present invention.

FIG. 39 shows a cross-sectional view of the module 800 that utilizes yet another method for minimizing pixel cross-talk. This particular embodiment includes a standoff 811 to introduce a discontinuity or separator in the light guide pathway (i.e., the flash 804) to disrupt transmission between the pixels 806. For example, as shown in FIG. 39, the light emitters 410 are mounted to standoffs 811 that are on the submount mounting surface 411. The standoffs 811 raise the pixels 806 a distance off the mount surface 411 such that the optical path within the residual flash 804 is not a straight path from one pixel to the next. The kink in the optical path introduces several hard angles and surfaces that significantly reduce the amount of light that is transmitted between the pixels 806 by total internal reflection. The emitters 410 may be electrically connected to the submount 404 through the standoffs 811 with vias 813, for example.

Again with reference to FIG. 36d, after the encapsulant 802 is applied to the submount 404 and any unwanted flash 804 is removed, a gap filler material 808 may be applied to the areas of the submount 404 between the pixels 806. The process should be well-controlled so as to avoid contaminating the pixels 806. The gap filler material 808 should be chosen such that it adheres well to the sidewalls of the pixels 806. The gap filler material 808 should have a dark color. Ideally, the gap filler material 808 will be black to provide the maximum contrast between the emission surface of the pixels 806 and the area surrounding them. In some embodiments, a black paint may be used. A suitable paint will have good flowing properties, good thermal/UV/moisture stability, and good adhesion to the encapsulant 802 and the submount 404.

Figure 40:
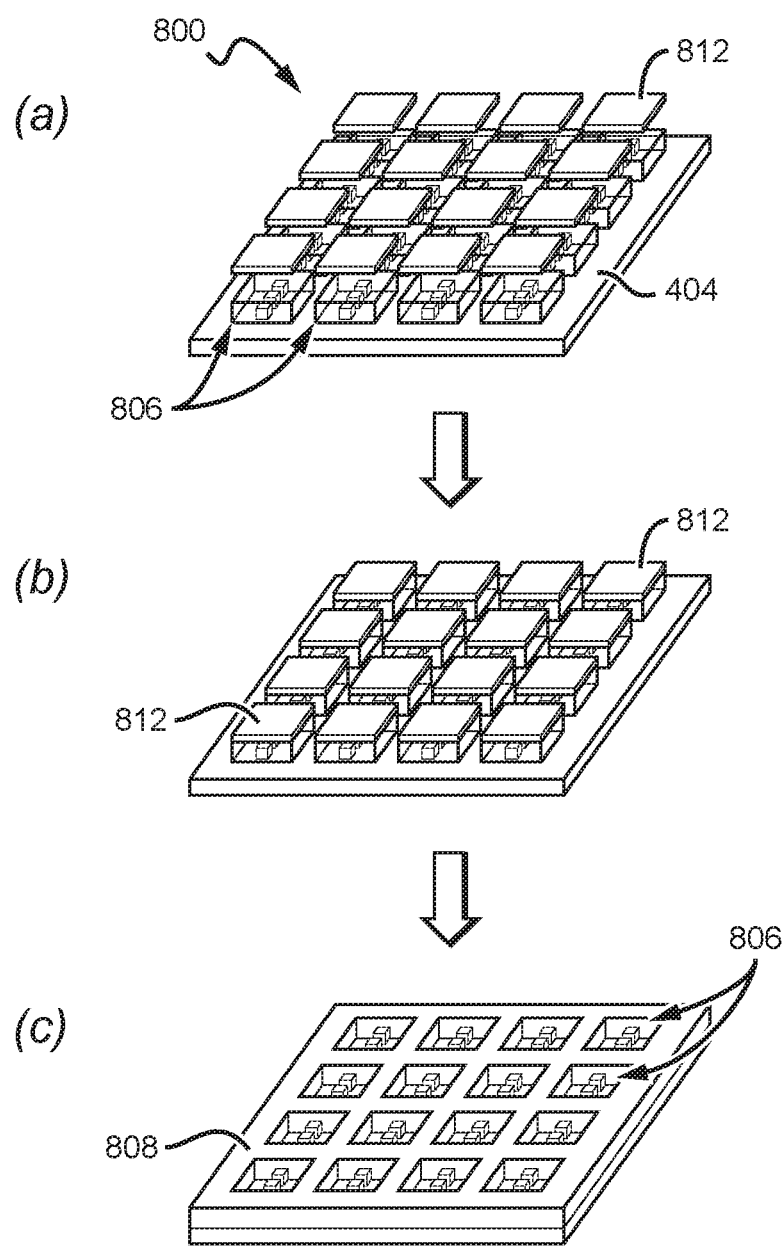
FIGS. 40a-c show a method of fabricating an emitter panel according to an embodiment of the present invention.

The gap filler material 808 may be applied using several different methods. For example, as shown in FIGS. 40a-c, a stencil method may be used. After the encapsulant 802 is applied to the submount 404 and any unwanted flash 804 removed, a stencil 812 is placed over the module 800 such that the emission surfaces of the pixels 806 are covered as depicted in FIG. 40a. Then, the gap filler material 808 can be applied across the entire face of the module 800 as indicated by the arrows in FIG. 40b. In FIG. 40c, the stencil 812 is removed leaving the pixels 806 uncovered by the gap filler material 808. Several materials may be used for the stencil 812 with a suitable material having the following properties: low deformation, good resistance to chemical cleaning, reasonable material hardness to protect the encapsulant 802 during processing.

Figure 41:
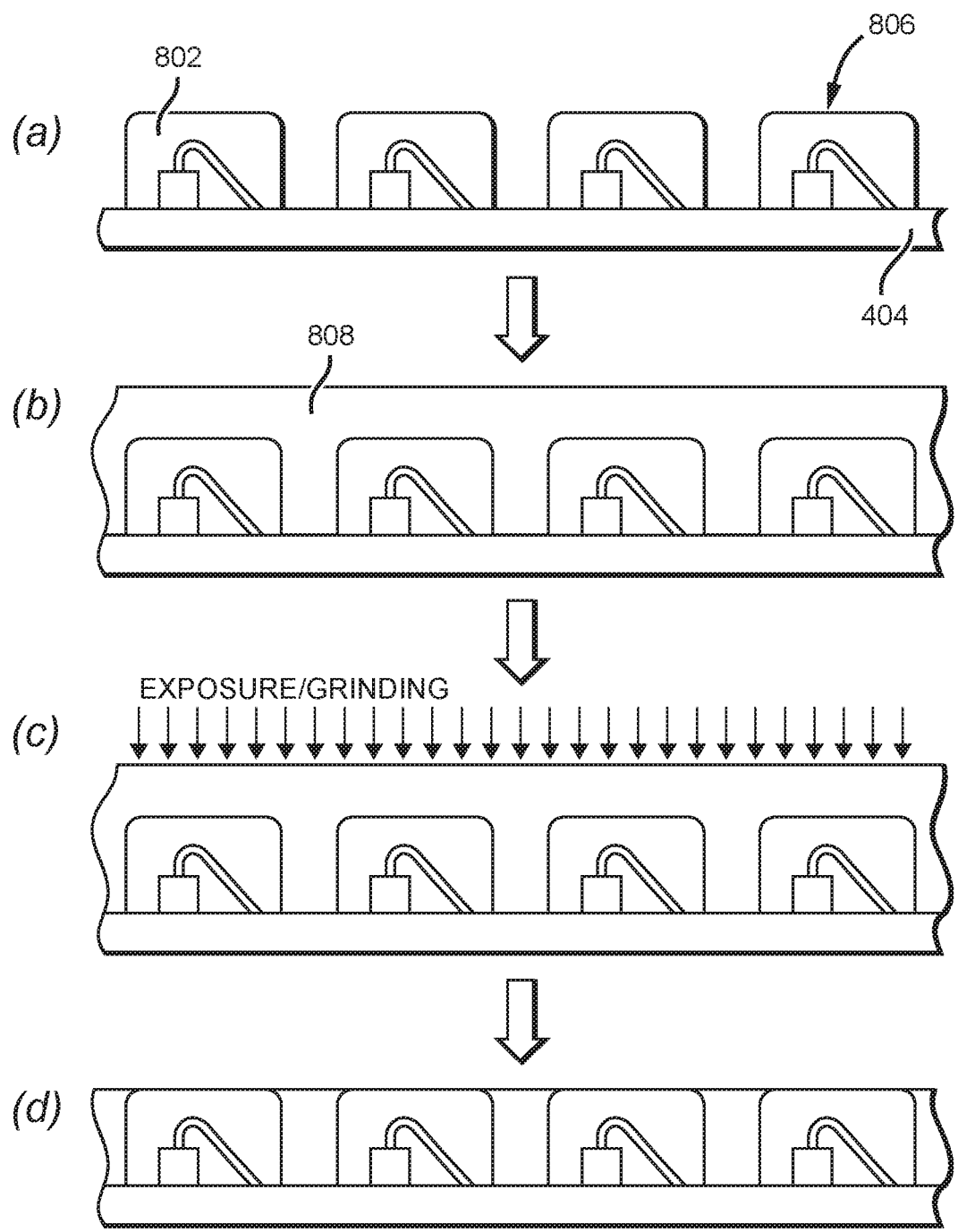
FIGS. 41a-d show a method of fabricating an emitter panel according to an embodiment of the present invention.

Another method for applying the gap filler material 808 is shown in FIGS. 41a-d. The process involves applying a dark-colored photo-sensitive gap filler material 808 over the encapsulant 802 and the submount 404 (FIG. 41b). Next, the gap filler material 808 is exposed to a particular dose of radiation/light as shown in FIG. 41c. By closely controlling the radiation dose, some of the material 808 in the gaps between the pixels 806 will not be removed based on the photon penetration property of the radiation used. As depicted in FIG. 41d, after development the gap filler material 808 can be removed to a depth such that it is coplanar with the emission surfaces of the pixels 806. A post-bake step may be necessary to harden the gap filler material 808.

Alternatively, as noted in FIG. 41c, the gap filler material 808 can be removed by mechanical means, such as grinding or cutting, for example. In this case, the gap filler material 808 does not need to be photo-sensitive, but merely able to withstand mechanical stress during the removal step. It is understood that many materials can be used as gap fillers and that many different methods can be used to both apply and remove them from the modules.

Although the present invention has been described in detail with reference to certain configurations thereof, other versions are possible. The emitter panels can have many different shapes and sizes, can be arranged in many different ways and can be made of many different materials. The pixels can be arranged in many different ways and in many different patterns. The pixels can be interconnected using many different features and with many interconnect structures. Therefore, the spirit and scope of the invention should not be limited to the versions described above.

We claim:

1. A method for fabricating a solid state emitter panel, comprising:
   providing a barrier on a submount such that a plurality of pixel areas are defined;
   affixing a plurality of light emitters such that each of said pixel areas has multiple light emitters therein;
   electrically connecting said light emitters to said submount, such that in each of said pixel areas, each of said multiple light emitters is powered by a unique combination of a control signal and a power signal such that each light emitter is individually and simultaneously controllable; and
   at least partially covering said light emitters in said pixel areas with an encapsulant.

2. The method of claim 1, wherein said barrier is provided on said submount using an additive process.

3. The method of claim 1, wherein said barrier is a mask.

4. The method of claim 1, further comprising molding said barrier into a grid shape and affixing it to said submount.

5. The method of claim 1, further comprising stamping said barrier into a grid shape and affixing it to said submount.

6. The method of claim 1, further comprising drilling said barrier into a grid shape and affixing it to said submount.

7. The method of claim 1, wherein said barrier comprises a polymer material.

8. The method of claim 1, wherein said barrier comprises a polyphthalamide (PPA) material.

9. The method of claim 1, wherein said barrier comprises a printed circuit board (PCB) material.

10. The method of claim 1, further comprising applying an adhesive to said submount and affixing said barrier to said submount.

11. The method of claim 10, further comprising B-staging said adhesive after said adhesive is applied to said submount and prior to affixing said barrier to said submount.

12. The method of claim 10, wherein said adhesive is a Room Temperature Vulcanizing (RTV) material.

13. The method of claim 1, wherein light emitters in said pixel areas are covered by at least partially filling said pixel areas with an encapsulant material.

14. The method of claim 1, wherein said barrier is provided on said submount using a subtractive process.

15. The method of claim 1, wherein said barrier is provided by drilling recesses into said submount to define said pixel areas.

16. The method of claim 1, wherein said barrier is provided on said submount before said emitters are electrically connected to said submount.

17. The method of claim 1, wherein said barrier is provided on said submount after said emitters are electrically connected to said submount.

18. The method of claim 1, wherein said barrier is provided on said submount by affixing a molded encapsulant to said submount after said emitters have been electrically connected to said submount such that said emitters are within said pixel areas.

19. The method of claim 18, further comprising cutting a plurality of grooves into said submount between said pixel areas prior to affixing said encapsulant to said submount.

20. The method of claim 18, further comprising removing flash material from said submount between said pixel areas.

21. The method of claim 18, further comprising filling in areas of said submount between said pixel areas with a filler material.

22. The method of claim 21, wherein said filling comprises covering said pixel areas with a stencil and applying paint on said areas of said submount between said pixel areas and on sidewalls of said molded encapsulant.

23. The method of claim 21, wherein said filling comprises applying a conformal photo-sensitive material to said submount and said molded encapsulant and exposing said photo-sensitive material for a duration such that some of said photo-sensitive material remains in said areas of said submount between said pixel areas and on sidewalls of said molded encapsulant after development of said photo-sensitive material.

24. The method of claim 21, wherein said filling comprises applying a conformal material to said submount and said molded encapsulant and mechanically removing said material to an extent such that an emission surface of said molded encapsulant is exposed and some of said material remains in said areas of said submount between said pixel areas and on sidewalls of said molded encapsulant.

25. The method of claim 21, wherein said filler material is black.

26. The method of claim 1, wherein said affixing comprises affixing said light emitters such that each of said pixel areas has at least first, second, and third light emitters therein, wherein said first light emitter provides red light, said second light emitter provides green light, and said third light emitter provides blue light.

27. The method of claim 1, wherein said light emitters are electrically connected to said submount using wire bonds.

28. A solid state emitter panel, comprising:
a submount comprising a mount surface;
a barrier on and raised above said mount surface, said barrier defining an array of pixel areas;
a plurality of pixels arranged in said pixel areas on said submount, each of said pixels comprising:
multiple light emitters; and
an encapsulant at least partially covering said light emitters; and
a plurality of interconnections on said submount, said interconnections configured such that each of said light emitters is individually and simultaneously controllable;
wherein each of said light emitters within each of said pixels is powered by the same power signal but controlled by a different control signal.

29. The solid state emitter panel of claim 28, wherein each pixel comprises at least at least first, second, and third light emitters, wherein said first light emitter provides red light, said second light emitter provides green light, and said third light emitter provides blue light.

30. The solid state emitter panel of claim 28, wherein said barrier is defined by recesses in said submount such that said mount surface is sunken into said submount, said pixel areas being in said recesses.

31. The solid state emitter panel of claim 28, wherein said barrier comprises a mask on said submount.

32. The solid state emitter panel of claim 28, wherein said barrier comprises a molded encapsulant.

33. The solid state emitter panel of claim 28, further comprising an adhesive between said barrier and said submount.

34. The solid state emitter panel of claim of 28, further comprising filler material on said submount between said pixels.

35. The solid state emitter panel of claim 28, wherein portions of said submount have been removed to define grooves running between said pixels.

36. The solid state emitter panel of claim 28, wherein said pixels are arranged into at least one 4×4 array.

37. A light emitting pixel array, comprising:
a submount comprising a mount surface;
a barrier on and raised above said mount surface, said barrier defining an array of pixel areas on said submount;
a plurality of pixels arranged such that each of said pixels is in one of said pixel areas, each of said pixels comprising:
a plurality of light emitters; and
an encapsulant at least partially covering said light emitters; and
a plurality of interconnections on said submount, said interconnections configured such that a first power signal drives emission of said light emitters in a first pixel and a second pixel, a second power signal drives emission of said light emitters in a third pixel and a fourth pixel, a first set of control signals controls emission of said light emitters in said first pixel and said third pixel, and a second set of control signals controls emission of said light emitters in said second pixel and said fourth pixel.

38. The light emitting pixel array of claim 37, wherein said interconnections are arranged such that each of said light emitters within each of said pixels is individually controllable with respect to the other light emitters in that pixel.

39. The solid state emitter panel of claim 28, wherein the power signal powering said light emitters in a first of said pixels is different than the power signal powering the light emitters in a second of said pixels.

40. The solid state emitter panel of claim 39, wherein the control signals controlling said light emitters in the first of said pixels are all different than the control signals controlling said light emitters in the second of said pixels.

41. The solid state emitter panel of claim 28, wherein the control signals controlling said light emitters in a first of said pixels are all different than the control signals controlling said light emitters in a second of said pixels.

42. The solid state emitter panel of claim 28, wherein the power signal powering said light emitters in a first of said pixels is the same as the power signal powering said light emitters in a second of said pixels.

43. The solid state emitter panel of claim 42, wherein the control signals controlling said light emitters in the first of said pixels are all different than the control signals controlling said light emitters in the second of said pixels.

44. The solid state emitter panel of claim 28, wherein the control signals controlling the light emitters in a first of said pixels are the same as the control signals controlling the light emitters in a second of said pixels.

45. The solid state emitter panel of claim 44, wherein the power signal powering the light emitters in the first of said pixels is different than the power signal powering the light emitters in the second of said pixels.

46. The solid state emitter panel of claim 28, wherein a first of said pixels uses the same power signal but different control signals than a second of said pixels, and wherein said first of said pixels uses the same control signals but a different power signal than a third of said pixels.

47. The method of claim 1, wherein said barrier comprises a top surface that contrasts with the light emitted by said light emitters.

48. The method of claim 1, wherein said barrier extends up from a planar top surface of said submount.

* * * * *